(12) United States Patent
Kobayashi et al.

(10) Patent No.: US 7,289,055 B2
(45) Date of Patent: Oct. 30, 2007

(54) ANALOG-DIGITAL CONVERTER WITH GAIN ADJUSTMENT FOR HIGH-SPEED OPERATION

(75) Inventors: Shigeto Kobayashi, Gifu (JP); Kuniyuki Tani, Ogaki (JP); Atsushi Wada, Ogaki (JP); Noriaki Kojima, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 8 days.

(21) Appl. No.: 11/049,081

(22) Filed: Feb. 3, 2005

(65) Prior Publication Data
US 2005/0237234 A1 Oct. 27, 2005

(30) Foreign Application Priority Data
| Feb. 5, 2004 | (JP) | 2004-029879 |
| Feb. 6, 2004 | (JP) | 2004-031381 |
| Feb. 6, 2004 | (JP) | 2004-031382 |
| Mar. 12, 2004 | (JP) | 2004-071393 |

(51) Int. Cl.
*H03M 1/14* (2006.01)
(52) U.S. Cl. ...................... 341/161; 341/162
(58) Field of Classification Search ............... 341/156, 341/161–163
See application file for complete search history.

(56) References Cited

U.S. PATENT DOCUMENTS

| 5,047,772 | A | * | 9/1991 | Ribner | 341/156 |
| 5,159,342 | A | * | 10/1992 | Yotsuyanagi | 341/161 |
| 5,739,781 | A | * | 4/1998 | Kagey | 341/155 |
| RE36,014 | E | * | 12/1998 | Dedic | 341/172 |
| 6,097,326 | A | * | 8/2000 | Opris et al. | 341/161 |
| 6,195,032 | B1 | * | 2/2001 | Watson et al. | 341/162 |

(Continued)

FOREIGN PATENT DOCUMENTS

JP    04-026229    1/1992

(Continued)

OTHER PUBLICATIONS

Stata, User's Guid to Applying and Meauring Operation Amplifier Specifications, Sep. 1967, Analog Devices Inc., Analog Dialogue vol. 1, No. 3, pp. 9-16.*

(Continued)

*Primary Examiner*—Howard L. Williams
(74) *Attorney, Agent, or Firm*—McDermott Will & Emery LLP

(57) ABSTRACT

An input analog signal is fed to an amplifier circuit and an AD converter circuit. The AD converter circuit converts the input analog signal into a digital value of a predetermined number of bits, and outputs the digital value to an encoder (not shown) A DA converter circuit converts the digital value of a predetermined number of bits output from the AD converter circuit into an analog signal. The amplifier circuit samples and amplifies the input analog signal by a factor of α (greater than 1). A subtracter circuit subtracts an output of the DA converter circuit amplified by a factor of α from an output of the amplifier circuit.

24 Claims, 15 Drawing Sheets

U.S. PATENT DOCUMENTS

| | | | |
|---|---|---|---|
| 6,686,860 B2 * | 2/2004 | Gulati et al. | 341/155 |
| 6,710,735 B1 * | 3/2004 | Lin | 341/161 |
| 6,784,824 B1 * | 8/2004 | Quinn | 341/172 |
| 7,187,311 B2 * | 3/2007 | Wada et al. | 341/161 |

FOREIGN PATENT DOCUMENTS

| | | |
|---|---|---|
| JP | 2003-008439 | 1/2003 |
| JP | 2003-243986 | 8/2003 |

OTHER PUBLICATIONS

Japanese Office Action, with English Translation, issued on corresponding Japanese Patent Application No. JP 2004-071393, dated on Jul. 18, 2007.

Japanese Office Action, with English Translation, issued in corresponding Japanese Patent Application No. JP 20074-029879, dated on Jul. 31, 2007.

* cited by examiner

ANALOG-DIGITAL CONVERTER WITH GAIN ADJUSTMENT FOR HIGH-SPEED OPERATION

BACKGROUND OF THE INVENTION

1. Field of the Invention

The present invention generally relates to an analog-digital converter and, more particularly, to an analog-digital converter of a pipeline type and that of a cyclic type.

2. Description of the Related Art

In recent years, a variety of additional functions are built in mobile appliances such as a mobile telephone set, including the image pick-up function, the image playback function, the moving image pick-up function and the moving image playback function. In association with this, there is an increasing demand for miniaturization and power saving of an analog-digital converter (hereinafter, referred to as an AD converter). One mode of AD converter that addresses this demand is known as a cyclic AD converter which cycles through stages (see, for example, the Related art list No. 1).

FIG. 1 illustrates an example of a cyclic AD converter according to the related art. In this AD converter, an analog signal Vin input via a first switch SW1 is sampled and held by a sample and hold circuit 11 so that an analog signal equivalent to the input signal is held. An AD converter circuit 12 converts the signal thus held into a digital value. Initially, the higher 4 bits are retrieved. The digital value produced by conversion in the AD converter circuit 12 is converted into an analog value by a DA converter circuit 13. A subtracter circuit 14 subtracts the analog signal supplied from the DA converter circuit 13 from the input analog signal Vin sampled and held in the sample and hold circuit 11. An analog signal output from the subtracter circuit 14 is amplified by a second amplifier circuit 15. The amplified analog signal is fed back to the third sample and hold circuit 11 and the AD converter circuit 12 via a second switch SW2. 3 bits are retrieved in a second and subsequent cycles so that the second amplifier circuit 15 amplifies the input signal by a factor of 8. By repeating this process, a 10-bit digital value is obtained.

Related Art List

1. Japanese Patent Application Laid-open No. 4-26229

In the aforementioned AD converter of a cyclic type or the AD converter of a multiple-stage pipeline type, the higher bits are first retrieved and a corresponding analog signal is then subtracted from the input. Therefore, the analog signal after the subtraction should be amplified in accordance with the number of bits retrieved by the AD converter circuit in the subsequent stage.

However, the performance of an amplifier circuit is limited by a factor known as gain bandwidth product (GB product). The higher the target gain, the lower the operating frequency of the amplifier and the slower the operation. The operating speed equal to or higher than the overall speed of conversion is required in a cyclic type. Therefore, the amplifier circuit constitutes a limiting factor in the speed of operation of the AD converter as a whole.

SUMMARY OF THE INVENTION

The present invention has been done in view of the aforementioned circumstances and its objective is to improve the speed of an AD converter as a whole.

The present invention according one aspect provides an analog-digital converter. The analog-digital converter comprises: an AD converter circuit converting an input analog signal into a digital value of a predetermined number of bits; a DA converter circuit converting an output of the AD converter circuit into an analog signal; a first amplifier circuit provided parallel with the AD converter circuit and amplifying the input analog signal by a predetermined gain; a subtracter circuit subtracting an output of the DA converter circuit, amplified by a gain practically identical to the gain of the first amplifier circuit, from an output of the first amplifier circuit; and a second amplifier circuit amplifying an output of the subtracter circuit and feeding the amplified output back to inputs of the AD converter circuit and the first amplifier circuit.

Arbitrary combinations of the aforementioned constituting elements, and implementations of the invention in the form of methods, apparatus and systems may also be practiced as additional modes of practicing the present invention.

DETAILED DESCRIPTION OF THE INVENTION

First Embodiment

Figure 1:
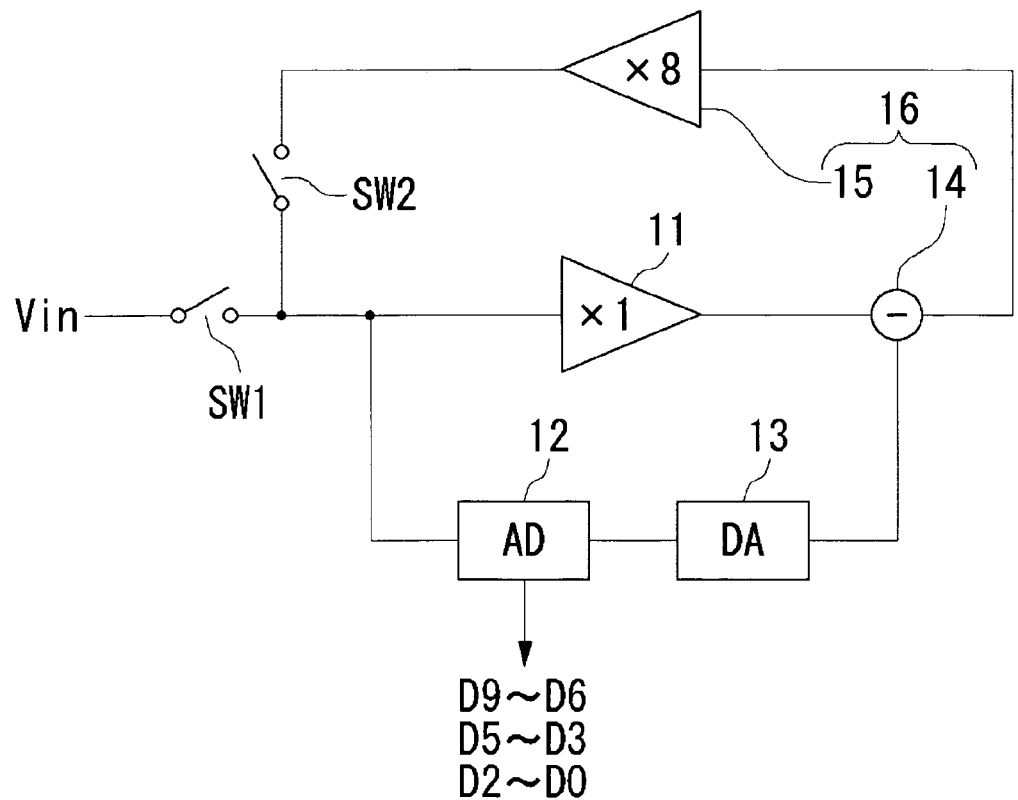
FIG. 1 illustrates the structure of an AD converter of a cyclic type according to the related art.

A representative aspect of the first embodiment will be described below. The first embodiment according to one aspect provides an analog-digital converter. The analog-digital converter according to this aspect comprises: an AD converter circuit converting an input analog signal into a digital value of a predetermined number of bits; a DA converter circuit converting an output of the AD converter circuit into an analog signal; a first amplifier circuit provided parallel with the AD converter circuit and amplifying the input analog signal by a predetermined gain; a subtracter circuit subtracting an output of the DA converter circuit; amplified by a gain practically identical to the gain of the first amplifier circuit, from an output of the first amplifier circuit; and a second amplifier circuit amplifying an output of the subtracter circuit and feeding the amplified output back to inputs of the AD converter circuit and the first amplifier circuit.

While the AD converter circuit is outputting a digital value of predetermined number of bits, the first amplifier circuit amplifies the input analog signal by a predetermined gain. The output of the DA converter circuit is amplified by the gain of the first amplifier circuit and subtracted from the output of the first amplifier circuit. The second amplifier circuit amplifies the output of the subtracter circuit and feeds the amplified output back to the AD converter circuit and the first amplifier circuit. By assigning the first amplifier circuit, equivalent to a sample and hold circuit of the related art, to the task of amplifying the analog signal for processing in a second and subsequent cycles in the AD converter of a cyclic type, the gain required of the second amplifier circuit is lowered so that the operation speed of the AD converter as a whole is improved.

The amplifying gain of the system comprising the AD converter and the DA converter circuit may be practically identical to the gain of the first amplifier. The ratio between a reference voltage range accommodating a reference potential of the DA converter circuit and a reference voltage range accommodating a reference potential of the AD converter circuit may be set in accordance with the predetermined gain.

By adjusting the ratio between the reference voltage range of the DA converter circuit and the reference range of the AD converter circuit, an output analog signal of the DA converter circuit commensurate with the gain of the first amplifier circuit can be generated.

The subtracter circuit and the second amplifier circuit may be an integral subtracting amplifier circuit. The integral subtracting amplifier circuit may amplify the output of the AD converter circuit by a gain which is practically identical to the gain of the first amplifier circuit. The integral subtracting amplifier circuit may amplify a result of subtraction from the output of the first amplifier circuit. The integral subtracting amplifier circuit may include an operational amplifier. A first terminal for receiving the output of the first amplifier circuit and a second terminal for receiving the output of the DA converter circuit may be connected to the operational amplifier. The ratio between a capacitance connected between the second terminal and the DA converter circuit and a capacitance connected between the first terminal and the first amplifier circuit may be set in accordance with the predetermined gain.

By adjusting the output of the DA converter circuit in the operational amplifier, the output analog signal of the DA converter circuit commensurate with the gain of the first amplifier circuit can be produced.

Figure 2:
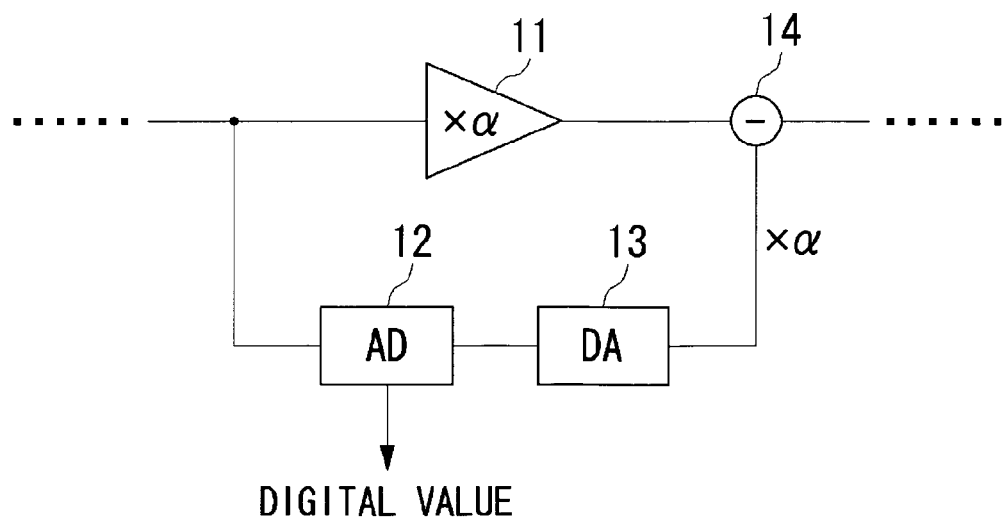
FIG. 2 illustrates the structure of a part of an AD converter of a pipeline type and that of a cyclic type according to a first embodiment of the present invention.

The basic concept behind the first embodiment of the present invention will be described. FIG. 2 is a basic circuit diagram showing the basic concept behind the first embodiment of the present invention. In this illustration of the basic circuit, a part of a cyclic or pipeline AD converter is shown. An input analog signal is fed to an amplifier circuit 11 and an AD converter circuit 12. The AD converter circuit 12 converts the input analog signal into a digital value of a predetermined number bits and outputs the digital value to an encoder (not shown). A plurality of reference potentials are set in the AD converter circuit 12. The number of reference potentials set differs depending on the number of output bits.

A DA converter circuit 13 converts the digital value of the predetermined number of bits output from the AD converter circuit 12 into an analog signal. The amplifier circuit 11 samples and amplifies the input analog signal. The gain of the amplifier circuit 11 is $\alpha$, where $\alpha$ is a value greater than 1. A subtracter circuit 14 subtracts the output of the DA converter circuit 13 from the output of the amplifier circuit 11. The output of the amplifier circuit 11 is $\alpha$ times the input analog signal. In association with this, the output of the DA converter circuit 13 should be multiplied by a factor of $\alpha$. With this arrangement, an analog signal having bit components output from the AD converter circuit 12 removed from the signal is generated. A specific structure to enable amplification by a factor of $\alpha$ will be described later.

In this way, an analog signal having bit components output from the AD converter circuit. 12 removed from the signal and amplified accordingly can be delivered to an amplifier circuit and an AD converter circuit 12 in the subsequent stage (not shown) This takes a load off from the processes in the subsequent stage. A similar thing is true of a cyclic type. More specifically, the gain of an amplifier circuit in a feedback circuit (not shown) can be lowered.

Figure 3:
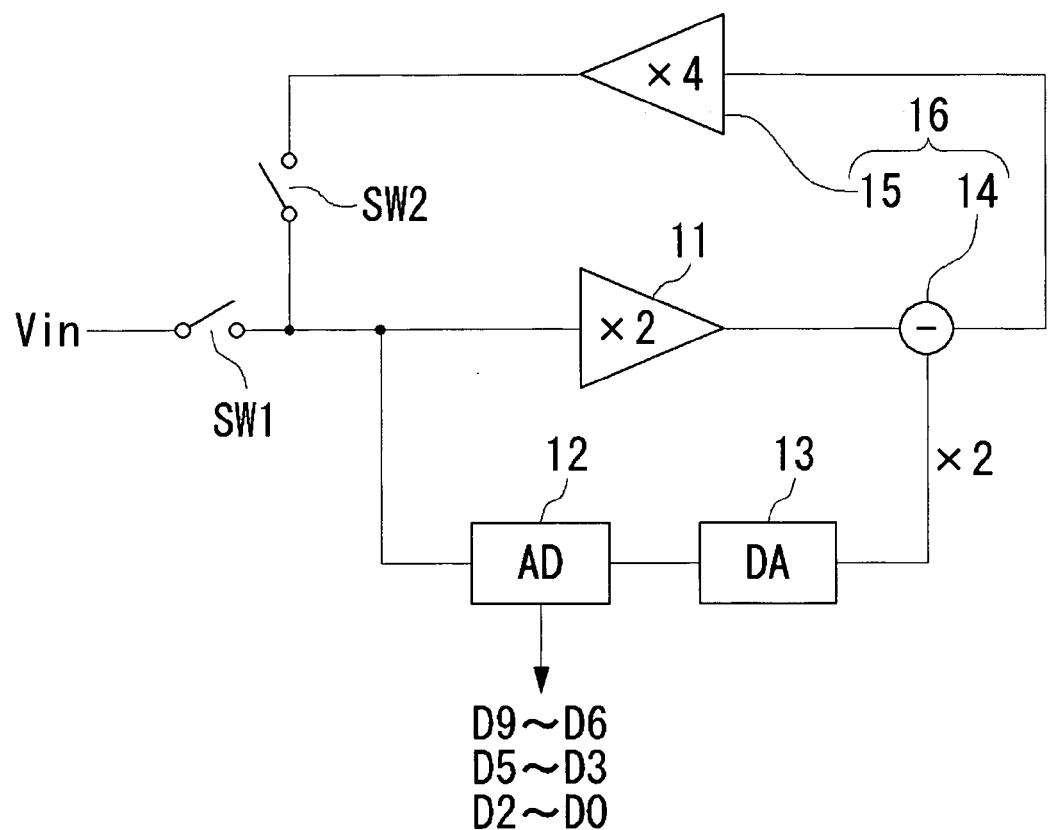
FIG. 3 illustrates the structure of an AD converter of a cyclic type according to the first embodiment.

FIG. 3 illustrates the structure of an AD converter of a cyclic type using the basic structure shown in FIG. 2. The input analog signal Vin is fed to the first amplifier circuit 11 and the first AD converter circuit 12 via a first switch SW1.

The input analog signal Vin could be an analog signal which is output from a unit in the preceding stage or the subsequent stage. The AD converter circuit 12 converts the input analog signal into a digital value of a maximum of 4 bits and outputs the value to an encoder (not shown). In a first cycle, the higher 4 bits (D9-D6) are output.

The DA converter circuit 13 converts the digital value of a maximum of 4 bits output from the AD converter circuit 12 into an analog signal. The first amplifier circuit 11 samples and amplifies the input analog signal Vin. The gain of the first amplifier 11 is 2. The subtracter circuit 14 subtracts the output of the DA converter circuit 13 from the output of the first amplifier circuit 11. With this, an analog signal having a component comprising the higher 4 bits removed from the signal is generated. The output of the first amplifier circuit 11 is twice the input analog signal Vin. In association with this, the output of the DA converter circuit 13 should also be amplified by a factor of 2. A specific structure to enable amplification by a factor of 2 will be described later. When the gain of the first amplifier circuit 11 is other than 2, the output of the DA converter circuit 13 should also be adapted for the gain.

The second amplifier circuit 15 amplifies the output of the subtracter circuit 14 by a factor of 4. The amplified output is fed back to the first amplifier circuit 11 and the AD converter circuit 12 via a second switch SW2. Assuming that the reference potential of the AD converter circuit 12 remains unchanged, the analog signal having a component comprising the higher 4 bits removed from the signal should practically be 8 (2 raised to the 3rd power) times the original, in order to retrieve 3 bits (D5-D3) in the second cycle. For this purpose, the first amplifier circuit 11 (×2) and the second amplifier circuit 15 (×4) practically enable an amplification by a factor of 8.

The AD converter circuit 12 outputs the 3 bits (D5-D3) to the encoder (not shown) in the second cycle. The DA converter circuit 13 converts the digital value of 3 bits (D5-D3) output from the AD converter circuit 12 into an analog signal. Subsequently, the process similar to the process of the first cycle is repeated.

To summarize, the first switch SW1 is turned on and the second switch SW2 is turned off in the first stage. The AD converter circuit 12 generates the 1st through 4th highest bits (D9-D6) of the 10 bits ultimately produced. In the second and third stages, the first switch SW1 is turned off and the second switch SW2 is turned on. The 5th through 7th highest bits (D5-D3) and the eighth through 10th highest bits (D2-D0) of the 10 bits are generated.

When the AD converter circuit 12 outputs 2 bits in the second and subsequent cycles, an additional cycle is necessary. In this case, the first amplifier circuit 11 and the second amplifier circuit 15 amplify by a factor of 4 instead of 8.

In the description given above, the subtracter circuit 14 and the second amplifier circuit 15 are described as being separate. Alternatively, a subtracting amplifier circuit 16 provided with the subtracting function may be used. In this way, the circuit is simplified. As mentioned later, the ratio between the output of the first amplifier circuit 11 and the output of the DA converter circuit 13 may be adjusted.

First Example of the First Embodiment

Figure 4:
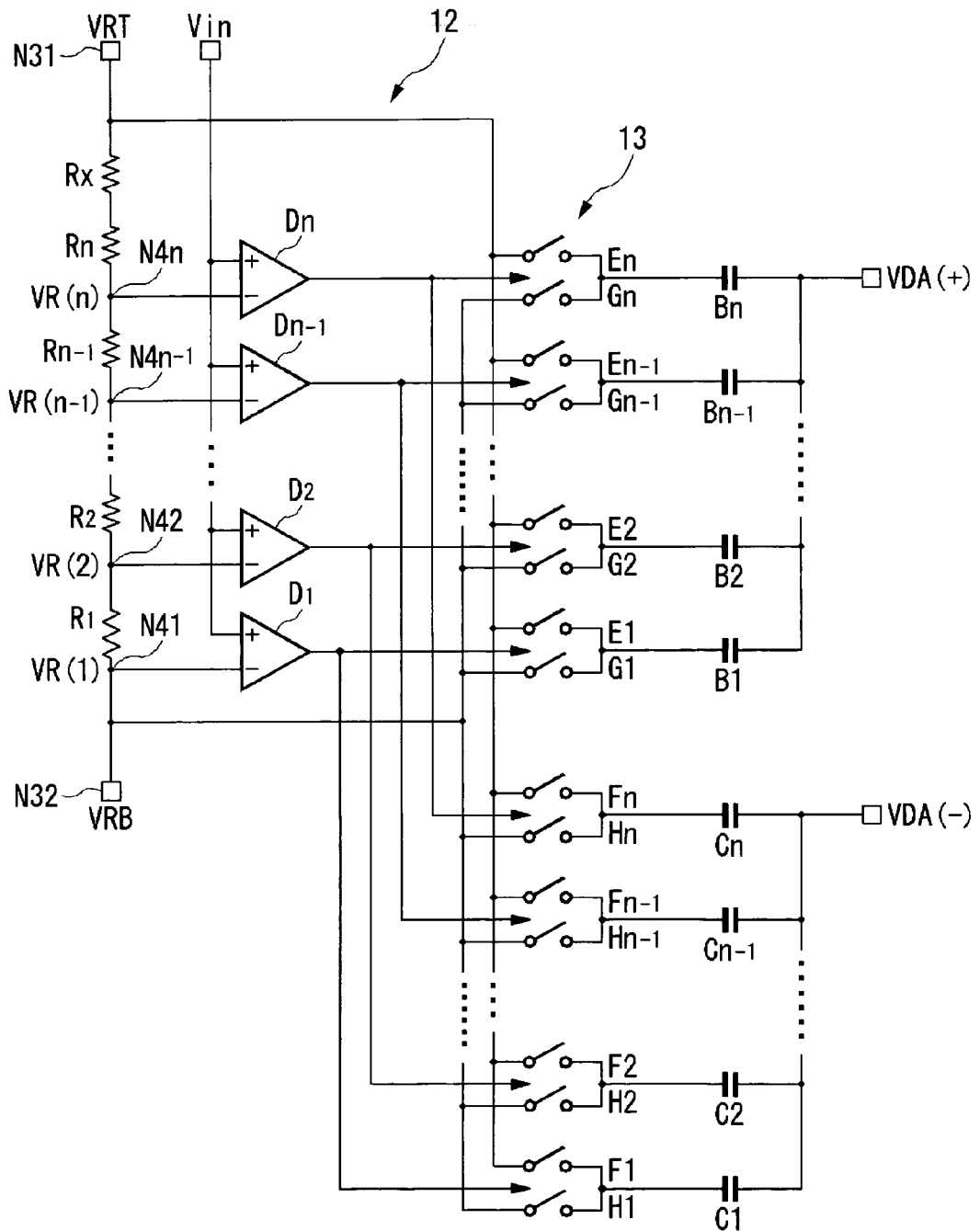
FIG. 4 illustrates the structure of an AD converter circuit and a DA converter circuit according to a first example of the first embodiment.

A description will now be given of a method of amplifying the output of the DA converter circuit by a factor of α. FIG. 4 is a circuit diagram showing the AD converter circuit and the DA converter circuit in the AD converter shown in FIGS. 2 and 3. The AD converter circuit 12 is a flash AD converter capable of fully parallel comparison. The AD converter circuit 12 is provided with n resistors R, a resistor Rx and n voltage comparison elements D1-Dn. Outputs of the voltage comparison elements D1-Dn are fed to the DA converter circuit 13 and an encoder (not shown).

The resistors R1-$n$ and the resistor Rx are connected in series between a high-potential node N31 receiving a higher reference voltage VRT and a lower-potential node N32 receiving a lower reference voltage VRB. It will be assumed that nodes N41-N4$n$, respectively sandwiched by the n resistors R1-$n$ between the low-potential node N32 and the high-potential node N31 and between the resistor R1 and the low-potential node N32, are at reference potentials of VR(1)-VR(n), respectively. The resistors R1-Rn are of the same resistance so that the reference potentials VR(1)-VR(n) with a regular step size are produced.

Since the AD converter, circuit 12 is of a single input, the reference voltage range thereof is simply given by (higher reference voltage VRT-lower reference voltage VRB). Since the DA converter circuit 13 is of a differential input, the reference voltage range is defined by |higher reference voltage VRT-lower reference voltage VRB| and |lower reference voltage VRB-higher reference voltage VRT|. Accordingly, even when the resistor Rx is not connected, the reference voltage range of the DA converter circuit 13 of a differential configuration may be set to a level twice the reference voltage range of the AD converter circuit 12, by configuring the AD converter circuit 12 as a single input circuit.

The resistor Rx is provided to drop the higher reference voltage VRT. When it is desired that the output of the DA converter circuit be amplified by a factor of 4, the higher reference voltage VRT is dropped to ½. In this case, the combined resistance of the resistors R1-Rn is set to be equal to the resistance of the resistor Rx. When it is desired that the output of the DA converter circuit 13 be amplified by a factor of 8, the higher reference voltage VRT is dropped to ¼. By configuring the resistor Rx as a variable resistor, the reference voltage range of the AD converter circuit 12 is arbitrarily modified. Described above is an example where the AD converter circuit 12 is of a single input configuration and the DA converter circuit 13 is of a differential input configuration. The resistor Rx may also be applied to a configuration in which both are of a single input configuration or both are of a differential input configuration. In this case, insertion of the resistor Rx as described above results in the reference voltage range of the DA converter circuit 13 to be multiplied by 2 and 4, respectively, instead of 4 and 8.

The analog input signal Vin is fed to the non-inverting input terminals of the voltage comparison elements D1-Dn. The reference potentials VR(1)-VR(n) at the nodes N41-N4$n$, respectively, are supplied to the inverting input terminals of the voltage comparison elements D1-Dn.

With this, each of output signals VD1-VDn of the voltage comparison elements D1-Dn is high when the analog input signal Vin is higher than the corresponding one of the reference potentials VR(1)-VR(n). Each of the output signals VD1-VDn is low when the analog signal Vin is lower than corresponding one of the reference potentials VR(1)-VR(n).

The encoder (not shown) encodes the output signals VD1-VDn of the voltage comparison elements D1-Dn, respectively, and outputs a digital signal of a bit size corresponding to-the number of voltage comparison elements D1-Dn.

The DA converter circuit is a DA converter circuit of a capacitor array type. The DA converter circuit 13 is constructed such that n positive-end VRT switches E1-En, negative-end VRT switches F1-Fn, positive-end VRB switches G1-Gn, negative-end VRB switches H1-Hn, n positive-end capacitors B1-Bn, and n negative-end capacitors C1-Cn are connected to each other in an array.

The positive-end capacitors B1-Bn and the negative-end capacitors C1-Cn all have the identical capacitance c. One terminal (hereinafter, referred to as an output terminal) of each of the positive-end capacitors B1-Bn generates a differential positive-end output voltage VDA(+). One terminal (hereinafter, referred to as an output terminal) of each of the negative-end capacitors C1-Cn generates a differential negative-end output voltage VDA(−). The other terminal of each of the positive-end capacitors B1-Bn and the negative-end capacitors C1-Cn will be referred to as an input terminal.

One terminal of each of the positive-end VRT switches E1-En is connected to the high-potential node N31, and the other terminal thereof is connected to the input terminal of the corresponding one of the positive-end capacitors B1-Bn. One terminal of each of the negative-end VRT switches F1-Fn is connected to the high-potential node N31, and the other terminal thereof is connected to the input terminal of the corresponding one of the negative-end capacitors C1-Cn. One terminal of each of the negative-end VRB switches G1-Gn is connected to the low-potential node N32, and the other terminal thereof is connected to the input terminal of the corresponding one of the positive-end capacitors B1-Bn. One terminal of each of the negative-end VRB switches H1-Hn is connected to the low-potential node N32, and the other terminal thereof is connected to the input terminal of the corresponding one of the negative-end capacitors C1-Cn.

Identically numbered switches of the positive-end VRT switches E1-En, the negative-end VRT switches F1-Fn, the positive-end VRB switches G1-Gn and the negative-end VRB switches H1-Hn constitute a quadruple switch. For example, the positive-end VRT switch E1, the negative-end VRT switch F1, the positive-end VRB switch G1 and the negative-end VRB switch H1 constitute an array of switches. The positive-end VRT switch En, the negative-end VRT switch Fn, the positive-end VRB switch Gn and the negative-end VRB switch Hn also constitute an array of switches. The positive-end VRT switches E1-En, the negative-end VRT switches F1-Fn, the positive-end VRB switches G1-Gn and the negative-end VRB switches H1-Hn are turned on or off in accordance with the output levels of the voltage comparison elements D1-Dn. For example, when the output of the voltage comparison element Dn is high, the positive-end VRT switch En and the negative-end VRB switch Hn are turned on, and the positive-end VRB switch Gn and the negative-end VRT switch Fn are turned off. Conversely, when the output of the voltage comparison element Dn is low, the positive-end VRT switch En and the negative-end VRB switch Hn are turned off, and the positive-end VRB switch Gn and the negative-end VRT switch Fn are turned on.

A description will now be given of the operation of the DA converter circuit 13. In an initial condition, the input terminals and the output terminals of the positive-end capacitors B1-Bn and the negative-end capacitors C1-Cn are at a practically 0V potential. The positive-end VRT switches E1-En, the negative-end VRT switches F1-Fn, the positive-end VRB switches G1-Gn and the negative-end VRB switches H1-Hn are all turned off. Accordingly, at the initial condition, each of the positive-end capacitors B1-Bn and the negative-end capacitors C1-Cn stores a charge Q1=0.

When m of the n voltage comparison elements D1-Dn go to a high-level output, m of the n positive-end VRT switches E1-En are turned on and (n-m) thereof are turned off. (n-m) of the n positive-end VRB switches G1-Gn are turned on and m thereof are turned off. The total charge Q2 stored in the positive-end capacitors B1-Bn in accordance with the on and off operation of the positive-end VRT switches E1-En and the positive-end VRB switches G1-Gn is given by the following equation (A1).

$$Q2 = m\{VRT - VDA(+)\}c + (n-m)(VRB - VDA(+))c \qquad (A1)$$

The principle of conservation of charge demands that Q1=Q2. Accordingly, the analog signal VDA(+) is given by the following equation (A2).

$$VDA(+) = VRB + m(VRT - VRB)/n \qquad (A2)$$

When m of the n voltage comparison elements D1-Dn go to a high-level output, m of the n negative-end VRB switches H1-Hn are turned on and (n-m) thereof are turned off. (n-m) of the n negative-end VRT switches F1-Fn are turned on and m thereof are turned off. The total charge Q3 stored in the negative-end capacitors C1-Cn in accordance with the on and off operation of the negative-end VRB switches H1-Hn and the negative-end VRT switches F1-Fn, is given by the following equation (A3).

$$Q3 = (n-m)\{VRT - VDA(-)\}c + m(VRB - VDA(-))c \qquad (A3)$$

The principle of conservation of charge demands that Q1=Q3. Accordingly, the analog signal VDA(−) is given by the following equation (A4).

$$VDA(-) = VRT - m(VRT - VRB)/n \qquad (A4)$$

Accordingly, a difference analog signal VDA is given by the following equation (A5) derived from the equations (A2) and (A4).

$$VDA = VDA(+) - VDA(-) = VRB - VRT + 2m(VRT - VRB)/n \qquad (A5)$$

Thus, by setting the reference voltage range {VRT−(voltage drop due to the resistor Rx)−VRB} supplied to the AD converter circuit 12 and the reference voltage range {|VRT−VRB|}×2 supplied to the DA converter circuit 13 at a predetermined ratio with respect to each other, the output of the DA converter circuit 13 can be amplified by a predetermined factor. When the AD converter circuit 12 is of a single input and the DA converter circuit 13 is of a differential input, the gain of 2 is obtained without connecting the resistor Rx. By connecting the resistor Rx, the reference voltage range of the AD converter circuit 12 can be modified. By connecting a resistor (not shown) to the DA converter circuit 13, the reference voltage range of the DA converter circuit 13 can be modified. Thus, since the reference voltage range of the AD converter circuit 12 and the DA converter circuit 13 can be modified arbitrarily, the ratio between the reference voltage ranges can be arbitrarily set. By setting the ratio between the reference voltage ranges, the output of the DA converter circuit 13 can be amplified in accordance with the gain of the first amplifier circuit 11.

Second Example of the First Embodiment

Figure 5:
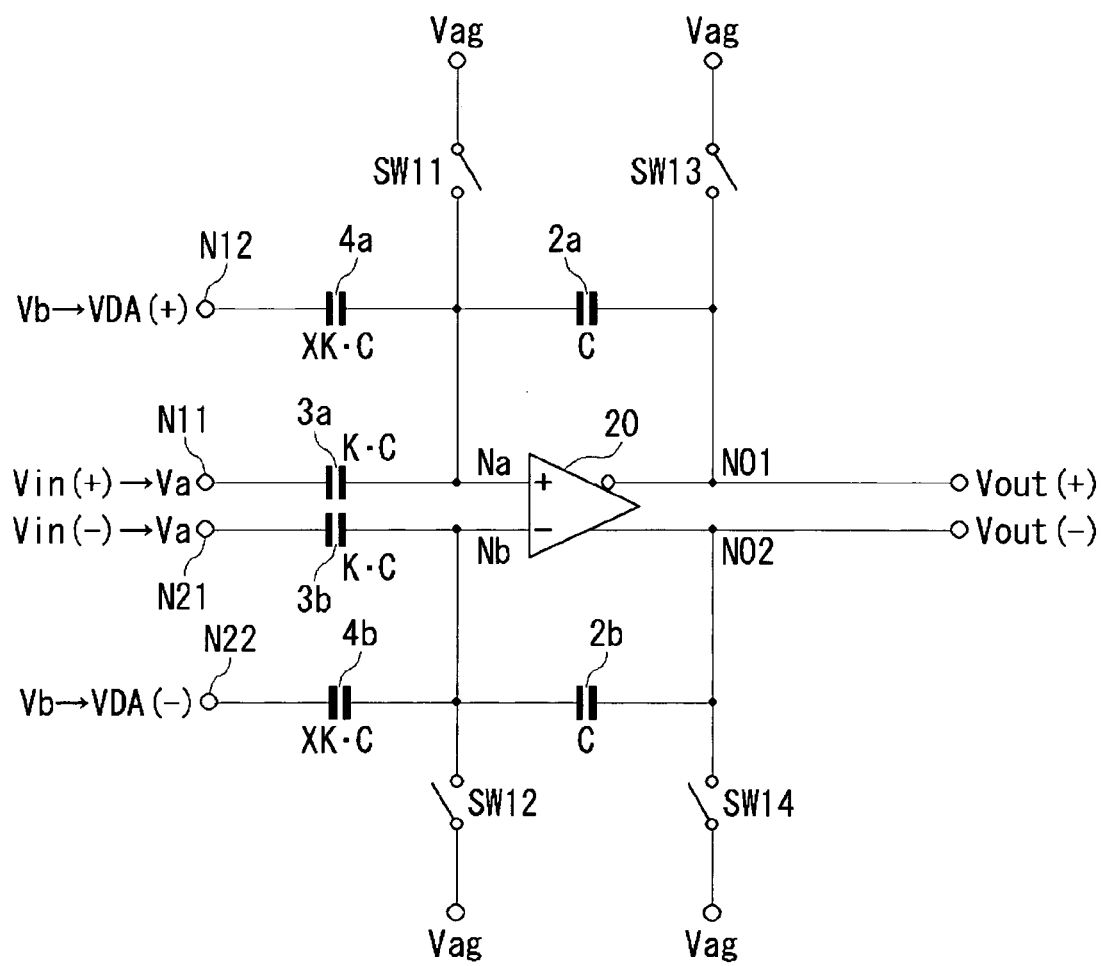
FIG. 5 illustrates the structure of a subtracting amplifier circuit according to a second example of the first embodiment.
Figure 6:
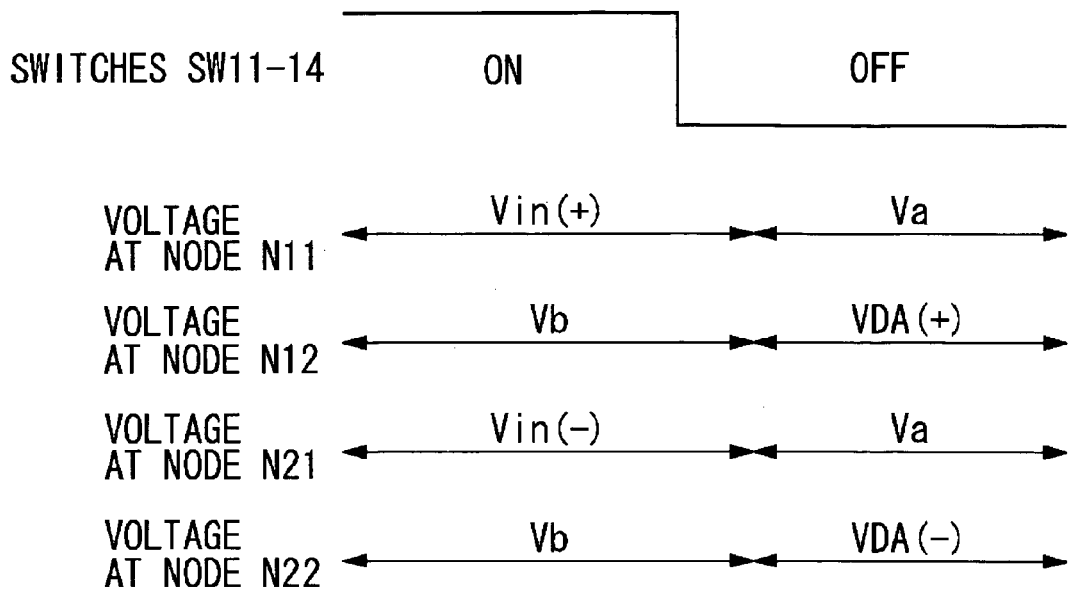
FIG. 6 is a time chart showing the operating process of a subtracting amplifier circuit according to the second example of the first embodiment.

In a second example of the first embodiment, the reference voltage range supplied to the AD converter circuit 12 and the reference voltage range supplied to the DA converter circuit 13 are maintained to be equal to each other, while the subtracting amplifier circuit 16 amplifies the output of the DA converter circuit 13 by a factor of α. FIG. 5 is a circuit diagram of the subtracting amplifier circuit. FIG. 6 is a timing chart illustrating the operation of the subtracting amplifier circuit. The subtracting amplifier circuit 16 is of a fully differential type in operation.

Referring to FIG. 5, the non-inverting input terminal of an operational amplifier 20 is connected to a +input-end node Na and the inverting input terminal is connected to a −input-end node Nb. The inverting output terminal of the operational amplifier 20 is connected to a +output-end node NO1 and is also connected to the non-inverting input terminal via a +end feedback capacitor 2a. The non-inverting output terminal is connected to a −output-end node NO2 and is also connected to the inverting input terminal via a −end feedback capacitor 2b.

The +input-end node Na is connected to an autozero potential via a third switch SW11, and the −input-end node Nb is connected to the autozero potential via a fourth switch SW12. The +input-end node Na is connected to a +Vin node N11 via a +Vin capacitor 3a and is also connected to a +VDA node N12 via a +VDA capacitor 4a. The +input-end node Nb is connected to a −Vin node N21 via a −Vin capacitor 3b and is also connected to a −VDA node N22 via a −VDA capacitor 4b. A fifth switch SW13 and a sixth switch SW14 are operated according to the same timing schedule as the third switch SW11 and the fourth switch SW12. Instead of connecting the third switch SW11 and the fifth switch SW13 to the autozero potential, a switch connecting the +input-end node Na and the +output-end node NO1 may be used. The same is true of the fourth switch SW12 and the sixth switch SW14.

A voltage that goes from Vin(+) to Va is fed to the +Vin node N11, and a voltage that goes from Vb to VDA(+) is fed to the +VDA node N12. A voltage that goes from Vin(−) to Va is fed to the −Vin node N21, and a voltage that goes from Vb to VDA(−) is fed to the −VDA node N22. Va and Vb are arbitrarily set voltages. A voltage Vout(+) is output from the +output end node NO1 and a voltage Vout(−) is output from the −output end node NO2. A difference voltage Vout between the +output-end node NO1 and the −output-end node NO2 is given by the following equation (A6).

$$Vout=Vout(+)-Vout(-) \quad (A6)$$

A description will now be given of the operation of the subtracting amplifier circuit of FIG. 5 by referring to FIG. 6. It is assumed here that the capacitance of the feedback capacitors 2a and 2b is C, and the capacitance of the Vin capacitors 3a and 3b is KC. The capacitance of the VDA capacitors 4a and 4b is assumed to be XKC, where K is a constant, and X is an arbitrary variable. The autozero potential is assumed to be Vag.

First, the third through sixth switches SW11-SW14 are turned on. The voltage Vin(+) is fed to the +Vin node N11, and the set voltage Vb is fed to the +VDA node N12. The voltage Vin(−) is fed to the −Vin node N21, and the set voltage Vb is fed to the −VDA node N22. The +output-end node NO1 and the −output-end node NO2 are brought to the autozero potential Vag. At this point of time, the charge QAA at the +input-end node Na is given by the following equation (A7).

$$QAA=\{Vag-Vin(+)\}KC+(Vag-Vb)XKC \quad (A7)$$

At this point of time, the charge QAB at the +input-end node Na is given by the following equation (A8).

$$QAB=\{Vag-Vin(-)\}KC+(Vag-Vb)XKC \quad (A8)$$

Subsequently, the third through sixth switches SW11-SW14 are turned off. The set voltage Va is fed to the +Vin node N11, and the voltage VDA(+) is fed to the +VDA node N12. The set voltage Va is fed to the −Vin node N21, and the voltage VDA(−) is fed to the −VDA node N22. The voltage at the +output-end node NO1 and that of the −output-end node NO2 are brought to Vout(+) and Vout(−), respectively. At this point of time, the charge QBA at the +input-end node Na is given by the following equation (A9).

$$QBA=(Vag-Va)KC+\{Vag-VDA(+)\}XKC+ \{Vag-Vout(+)\}C \quad (A9)$$

The charge QBB at the −input-end node Nb is given by the following equation (A10).

$$QBB=(Vag-Va)KC+\{Vag-VDA(-)\}XKC+ \{Vag-Vout(-)\}C \quad (A10)$$

Since there are no routes at the +input-end node Na and the −input-end node Nb for dissipating the charge, the principle of conservation of charge demands that QAA=QBA and QAB=QBB so that the following equations (A11) and (A12) hold.

$$Vout(+)=Vag+\{Vin(+)-VDA(+)X-Va+VbX\}K \quad (A11)$$

$$Vout(-)=Vag+\{Vin(-)-VDA(-)X-Va+VbX\}K \quad (A12)$$

Therefore, the differential voltage Vout is given by the following equation (A13).

$$Vout=Vout(+)-Vout(-)=\{Vin(+)-VDA(+)X-Va+ VbX\}K-\{Vin(-)-VDA(-)X-Va+VbX\}K= \{Vin(+)-VDA(+)X\}K-\{Vin(-)-VDA(-)X\}K= [\{Vin(+)-Vin(-)\}-X\{VDA(+)-VDA(-)\}]*K \quad (A13)$$

That is, the differential voltage that results from subtracting, from the differential input analog signal Vin, the differential analog signal VDA from the DA converter circuit 13 multiplied by X, and by multiplying the result of subtraction by K, is obtained.

By setting the variable X multiplied by the capacitance of the VDA capacitors 4a and 4b to be a desired value, the values of VDA(+) and VDA(−) fed from the DA converter circuit 13 can be adjusted. Accordingly, given that the gain of the first amplifier circuit 11 is 2 and that the same reference voltage range as supplied to the AD converter 12 is supplied to the DA converter circuit 13, the multiplication by 2 of the capacitance of the VDA capacitors 4a and 4b, by multiplying the variable X by 2, results in the output of the DA converter circuit 13 being multiplied by 2.

The second example of the first embodiment provides improved flexibility in controlling the gain since it does not depend on the reference potential of the AD converter circuit 12 and the DA converter circuit 13. That is, the practice of the second example is not limited by the reference voltage range generated by the externally provided higher reference voltage VRT and the lower reference voltage VRB. The first example and the second example of the first embodiment may be combined. That is, the analog signal VDA from the DA converter circuit 13 subjected to adjustment may further be adjusted by the capacitance of the subtracting amplifier circuit.

Given above is a description of the first embodiment based on the examples. The description of the embodiment is illustrative in nature and various variations in constituting elements and processes involved are possible. Those skilled in the art would readily appreciate that the variations are also within the scope of the present invention.

Parameters such as the number of bits produced as a result of conversion, allocation of conversion bits, the gain of the amplifier circuits and the capacitance given in the description above of the examples of the first embodiment are merely by way of example. Other parameter values may be employed in the variations.

In the first example, a resistor for dropping the higher reference voltage VRT is provided in the AD converter circuit in order to achieve a predetermined ratio between the reference voltage range of the AD converter circuit and the reference voltage range of the DA converter circuit. Both the AD converter circuit and the DA converter circuit may be provided with a resistor for voltage drop so that the adjustment may be made by controlling the ratio between the resistors. Other voltage adjustment methods may also be used in order to achieve a predetermined ratio between the reference voltage range of the AD converter circuit and the reference voltage range of the DA converter circuit.

Second Embodiment

The art related to the second embodiment will be discussed below. In recent years, a variety of additional functions are built in mobile appliances such as a mobile telephone set, including the image pick-up function, the image playback function, the moving image pick-up function and the moving image playback function. In association with this, there is an increasing demand for miniaturization and power saving of an analog-digital converter (hereinafter, referred to as an AD converter). One mode of AD converter that addresses this demand is known as a cyclic AD converter which cycles through stages (see, for example, the Related art list No. 1). The Related art list No. 1 discloses an AD converter comprising two stages including a part for cyclic conversion.

In the cyclic AD converter of FIG. 1 of the Related art list No. 1, the parallel A/D converter AD2 is assigned the task of converting into 3 bits. Therefore, amplification by a high gain of 8 is required before providing a subsequent input to the parallel A/D converter AD2. Since the sample and hold circuit S/H3 provided parallel with the parallel A/D converter 2 does not amplify a signal, amplification by a factor of 8 is required of the subtracter circuit SUB2 and the sample and hold circuit S/H4.

However, the performance of an amplifier circuit is limited by a factor known as gain bandwidth product (GB product). Accordingly, the amplifier circuit constitutes a limiting factor in the operation speed of the AD converter as a whole. That is, the higher the target gain, the lower the operating frequency of the amplifier and the slower the operation.

Another consideration is that an amplifier has an inherent output voltage range. An input voltage that causes deviation from the output voltage range after the amplification generates distortion in the amplified output voltage. In order to prevent a gain error from being created, an input voltage fitted in a predetermined range should be used. This makes it difficult to use a low voltage.

The second embodiment will be summarized as follows. The second embodiment has been developed in view of the aforementioned circumstances and its objectives are to improve the speed of a cyclic AD converter and to enable the use of a low voltage therein.

The second embodiment according to one aspect provides an analog-digital converter. The analog-digital converter according to this aspect comprises: an AD converter circuit converting an input analog signal into a digital value of a predetermined number of bits; a DA converter circuit converting an output of the AD converter circuit into an analog signal; a first amplifier circuit provided parallel with the AD converter circuit and amplifying the input analog signal by a first gain; a subtracter circuit subtracting an output of the DA converter circuit, amplified by a gain practically identical to the gain of the first amplifier circuit, from an output of the first amplifier circuit; and a second amplifier circuit amplifying an output of the subtracter circuit by a second gain and feeding the amplified output back to the AD converter circuit, wherein a total gain, which is a product of the first gain and the second gain, represents a required gain, and the first gain is greater than 1 and equal to or smaller than the second gain. For example, the first gain may be equal to or less than ½ of the second gain.

According to this aspect, given that there are two amplifier circuits constituting a cyclic AD conversion part, the gain of the amplifier provided in the post-subtraction stage can be lowered by setting the gain of the amplifier circuit at the input end to be greater than 1, thereby improving the operation speed of the amplifier circuit. Accordingly, the operation speed of the AD converter as a whole is improved. Further, by setting the gain of the amplifier circuit at the input end to be smaller than the gain of the amplifier provided in the post-subtraction stage, the input voltage range of the amplifier circuit at the input end is extended, enabling a low-voltage signal to be used for an input to the amplifier circuit at the input end. Accordingly, low-voltage operation of the AD converter as a whole is facilitated.

The first gain of the first amplifier circuit may be set to a maximum value that permits any input signal in a desired input voltage range to produce an output fitted in an output voltage range. The second gain may be set to a value which is responsible for the remainder of the required total gain. The two amplifier circuits can be configured at respective gain settings that maximize the speed of operation when a desired low voltage signal is used. Accordingly, the operation speed of the AD converter as a whole is improved and the use of a low voltage is facilitated.

The second embodiment according to another aspect also provides an analog-digital converter. The analog-digital converter according to this aspect is an analog-digital converter of a pipeline type comprising a plurality of stages, wherein at least one of the plurality of stages is a cyclic stage that includes the analog-digital converter according to one of the aforementioned aspects.

According to this aspect, precision in conversion into the higher bits is improved, and the operation speed of the AD converter as a whole is improved due to the high-speed operation in the cyclic part. Further, by ensuring a sufficiently extensive input voltage range of the amplifier circuit at the input end of the cyclic part, the use of a low voltage in the AD converter as a whole is facilitated.

The first gain may be 2. In this situation, the output of the DA converter circuit should be amplified by a factor of 2. The amplification by a factor of 2 is implemented relatively easily. For example, a single input may be provided to the AD converter circuit and a differential output is obtained from the DA converter circuit. With this, the ratio between the reference voltage range of the AD converter circuit and that of the DA converter circuit is 1:2 so that it is not necessary to create an additional reference voltage.

Arbitrary combinations of the aforementioned constituting elements, and implementations of the second embodiment in the form of methods, apparatus and systems may also be practiced as additional modes of the present invention.

Examples of practicing the second embodiment will be described below.

First Example of the Second Embodiment

Figure 7:
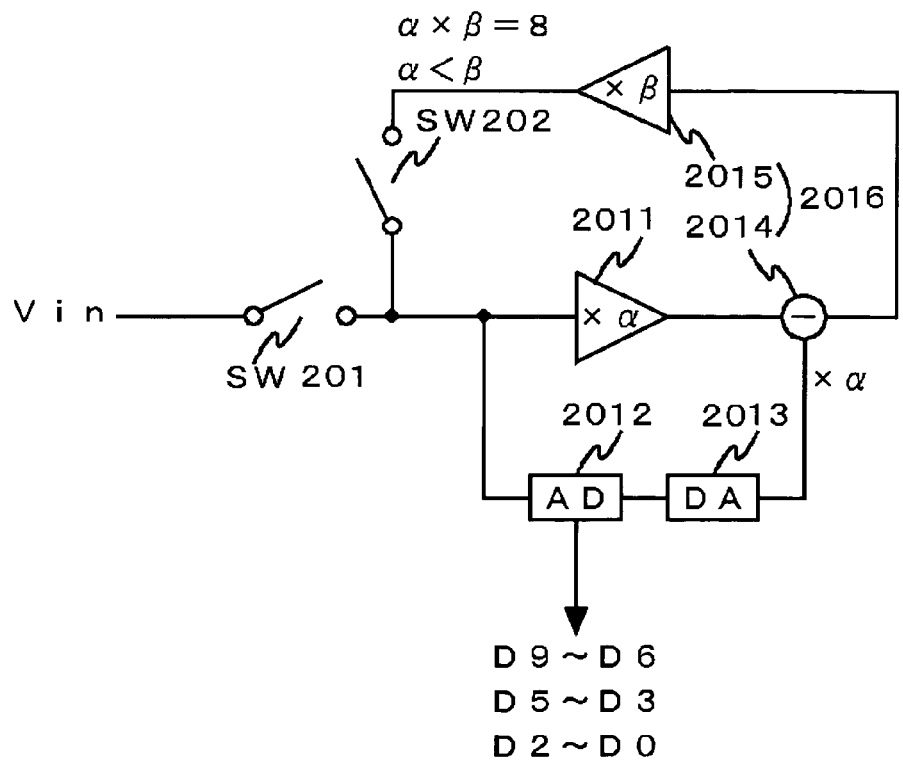
FIG. 7 illustrates the structure of an AD converter according to a first example of a second embodiment of the present invention.

FIG. 7 illustrates the structure of the AD converter of a cyclic type according to a first example of the second embodiment. The AD converter converts into a digital value comprising a total of 10 bits by going through 3 cycles. At an initial stage, a first switch SW201 is turned on, and a second switch SW202 is turned off. The input analog signal. Vin is fed to a first amplifier circuit 2011 and an AD converter circuit 2012 via the first switch SW201. The AD converter circuit 2012 converts the input analog signal into a digital value of a maximum of 4 bits and outputs the value to an encoder (not shown). In a first cycle, the higher 4 bits (D9-D6) of the 10 bits are output.

A DA converter circuit 2013 converts the digital value of a maximum of 4 bits output from the AD converter circuit 2012 into an analog signal. The first amplifier circuit 2011 samples and amplifies the input analog signal Vin. The gain of the first amplifier circuit 2011 is α. A subtracter circuit 2014 subtracts the output of the DA converter circuit 2013 from the output of the first amplifier circuit 2011. With this, an analog signal having a component comprising the higher 4 bits removed from the signal is generated. The output of the first amplifier circuit 2011 is α times the input analog signal Vin. In association with this, the output of the DA converter circuit 2013 should also be amplified by a factor of α.

A description will be given of a method of amplifying the output of the DA converter circuit 2013 by a factor of α. The higher reference voltage VRT and the lower reference voltage VRB are supplied to the AD converter circuit 2012 and the DA converter circuit 2013. The AD converter circuit 2012 uses a reference voltage range generated by the higher reference voltage VRT and the lower reference voltage VRB to generate reference voltages. In a capacitor array system, the DA converter circuit 2013 obtains an output voltage by selectively supplying the higher reference voltage VRT and the lower reference voltage VRB to each of a plurality of capacitors (not shown) under the control of the AD converter circuit 2012. The reference voltage range of the DA converter circuit 2013 is also generated based on the higher reference voltage VRT and the lower reference voltage VRB. The reference voltage range of the AD converter circuit 2012 and the reference voltage range of the DA converter circuit 2013 may be set to a ratio of 1:α. For example, given that the gain of the first amplifier circuit 2011 is 2, the reference voltage range of the AD converter circuit 2012 and the reference voltage range of the DA converter circuit 2013 may be set to a ratio of 1:2.

The second amplifier circuit 2015 amplifies the output of the subtracter circuit 2014 by a factor of β. The subtracter circuit 2014 and the second amplifier circuit 2015 may be an integral subtracting amplifier circuit 2016. In this way, the circuit is simplified.

At this point of time, the first switch SW201 is turned off and the second switch SW202 has made a transition to an on state. The second amplifier circuit 2015 feeds the amplified signal back to the first amplifier circuit 2011 and the AD converter circuit 2012 via the second switch SW202. Assuming that the reference potential of the AD converter circuit 2012 remains unchanged, the analog signal having a component comprising the higher 4 bits removed from the signal should practically be 8 (2 raised to the 3rd power) times the original, in order to retrieve 3 bits (D5-D3) in the next cycle. This means that the total gain, which is a product of the gain a of the first amplifier circuit 2011 and the gain β of the second amplifier circuit 2015, should practically be 8.

The AD converter circuit 2012 outputs the 3 bits (D5-D3) to the encoder (not shown) in the second cycle. The DA converter circuit 2013 converts the digital value of 3 bits (D5-D3) output from the AD converter circuit 2012 into an analog signal. Subsequently, the process similar to that of the first cycle is repeated.

To summarize, the first switch SW201 is turned on and the second switch SW202 is turned off in the first stage. The AD converter circuit 2012 converts into the 1st through 4th highest bits (D9-D6) of the 10 bits ultimately produced. In the second and third stages, the first switch SW201 is turned off and the second switch SW202 is turned on. The AD converter circuit 2012 converts into the 5th through 7th highest bits (D5-D3) and the eighth through 10th highest bits (D2-D0) of the 10 bits.

A description will be given of an example of setting the gain α of the first amplifier circuit 2011 and the gain β of the second amplifier circuit 2015. The gain of the first amplifier circuit 2011 may be set to a value greater than 1. With this, the gain of the second amplifier circuit 2015 can be lowered so that the operation speed of the second amplifier circuit 2015 is improved. Accordingly, the operation speed of the AD converter as a whole is improved. Since the output signal of the first amplifier circuit 2011 is, amplified, tolerance for random noise etc. is improved. More, specifically, since a large signal is fed to the second amplifier circuit 2015, thermal noise is handled relatively easily. This is because the capacitance for amplification in the second amplifier circuit 2015 becomes relatively small. Since a relatively large signal is fed to the subtracter circuit 2014, requirement for absolute precision in the subtracter circuit 2014 (for example, requirement for noise suppression at a node connected to the switch) is lowered. Moreover, an error in the output signal of the DA converter circuit 2013 causes less severe effects.

The gain of the first amplifier circuit 2011 may be set to 2 and the gain of the second amplifier circuit 2015 may be set to 4. By setting the gain of the first amplifier circuit 2011 to be equal to or smaller than the gain of the second amplifier circuit 2015, the input voltage range of the first amplifier circuit 2011 is extended so that the use of a low analog voltage for input to the first amplifier circuit 2011 is facilitated.

Figure 8:
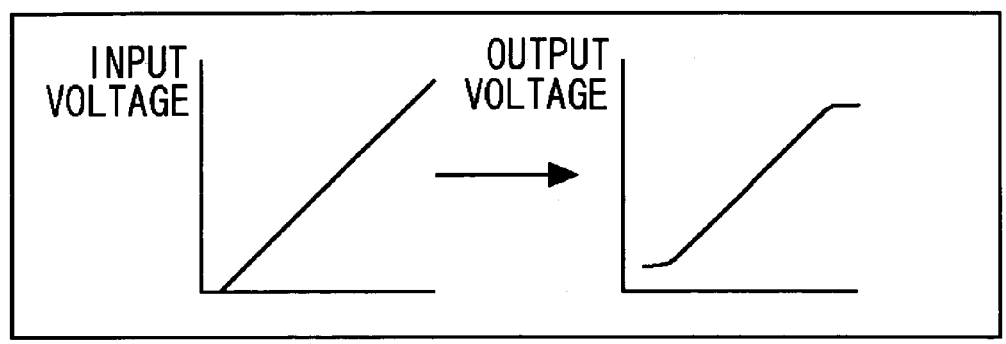
FIG. 8 illustrates an input voltage vs. output voltage characteristic occurring when the output voltage range of an amplifier circuit according to the second embodiment is not sufficiently wide.

FIG. 8 illustrates the characteristic of input voltage vs. output voltage occurring when the output voltage range of the amplifier circuit is not sufficiently extensive. The output voltage range as illustrated is inherent in the amplifier circuit, i.e. there is a zone in which the linearity of the output voltage with respect to the input voltage cannot be preserved. Therefore, the output voltage range and the gain determine an input voltage range under which proper operation is guaranteed. By lowering the gain of the first amplifier circuit 2011, a relatively extensive input voltage range of the first amplifier circuit 2011 is secured. With this, proper operation is guaranteed in a low input voltage condition. Since the second amplifier circuit 2015 receives a difference between the output of the first amplifier circuit 2011 and the signal subjected to AD/DA conversion by the AD converter circuit 2012 and the DA converter circuit 2013, the voltage range of the input to the second amplifier circuit 2015 is less extensive than the that of the first amplifier circuit 2011. In this background, it is ensured that the input voltage range of first amplifier circuit 2011 is more extensive than that of the second amplifier circuit 2015. Further, since the first amplifier circuit 2011 amplifies bits that are higher in the order than the second amplifier circuit 2011, higher precision is required.

When due consideration is given to all that is described above, the gain of the first amplifier circuit 2011 and the second amplifier circuit 2015 should be set as follows, to enable the highest speed in a low input voltage operation. The gain of the first amplifier circuit 2011 should be set to a maximum value that permits any input signal in a desired input voltage range to produce an output fitted in the output voltage range of the first amplifier circuit 2011. The gain of the second amplifier circuit 2015 should be set to a value which is responsible for the remainder of the required total gain.

Second Example of the Second Embodiment

Figure 9:
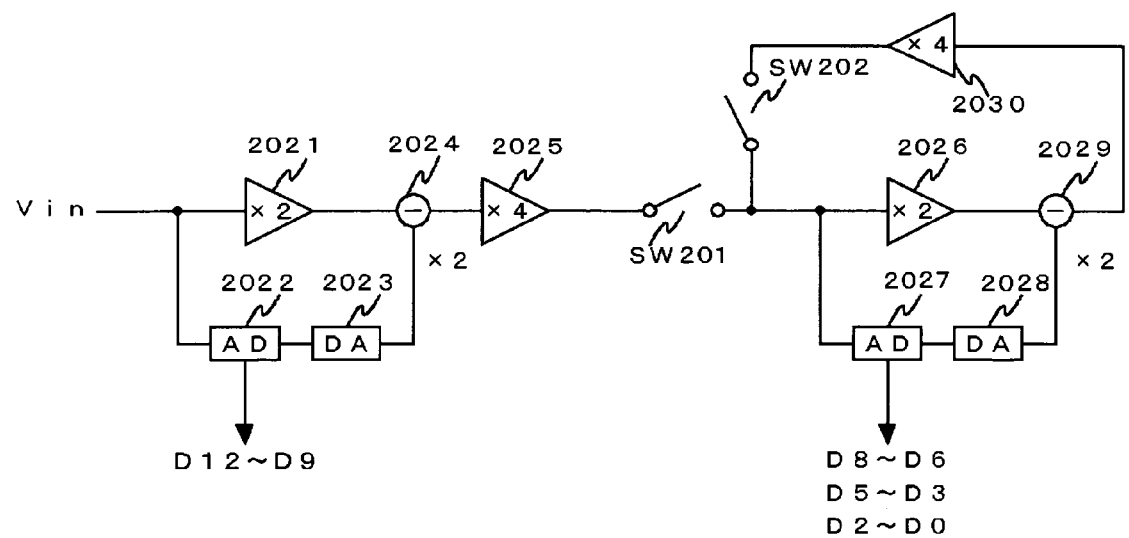
FIG. 9 illustrates the structure of an AD converter according to the second example of the second embodiment.

FIG. 9 illustrates the structure of the AD converter of a pipeline type that includes an AD conversion part of a cyclic type according to a second example of the second embodiment. This example provides an AD converter in which, a first AD converter circuit 2022 in the preceding stage converts into 4 bits and a second AD converter circuit 2027 of a cyclic type in the subsequent stage converts into 3 bits in each of 3 cycles, thus producing a total of 13 bits by conversion.

At an initial stage, the first switch SW201 is turned on and the second switch SW202 is turned off. The input analog signal Vin is fed to the first amplifier circuit 2021 and the first AD converter circuit 2022. The first AD converter circuit 2022 converts the input analog signal into a digital value and outputs the higher 4 bits (D12-D9) to an encoder (not shown). The first DA converter circuit 2023 converts the digital value produced by conversion by the first AD converter circuit 2022 into an analog value. The first amplifier circuit 2011 samples the input analog signal and amplifies the same by a factor of 2 and outputs the amplified signal to a first subtracter circuit 2024. The first subtracter circuit 2024 subtracts the output of the first DA converter circuit 2023 from the output of the first amplifier circuit 2021. The second amplifier circuit 2025 amplifies the output of the first subtracter circuit 2024 by a factor of 4. In association with the gain of the first amplifier circuit 2021, the output of the first DA converter circuit 2023 is amplified by a factor of 2. The first subtracter circuit 2024 and the second amplifier circuit 2025 may be an integral subtracting amplifier circuit.

The analog signal input via the first switch SW201 is fed to a third amplifier circuit 2026 and a second AD converter circuit 2027. The second AD converter circuit 2027 converts the input analog signal into a digital value and outputs the 5th through 7th highest bits (D8-D6) to the encoder (not shown). The second DA converter circuit 208 converts the digital value produced by conversion by the second AD converter circuit 2027 into an analog value.

The third amplifier circuit 2026 amplifies the input analog signal by a factor of 2 and outputs the amplified signal to a second subtracter circuit 2029. The second subtracter circuit 2029 subtracts the output of the second DA converter circuit 2028 from the output of the third amplifier circuit 2026. In association with the gain of the third amplifier circuit 2026, the output of the second DA converter circuit 2028 is amplified by a factor of 2. The fourth amplifier circuit 2030 amplifies the output of the second subtracter circuit 2029 by a factor of 4. The second subtracter circuit 2029 and the fourth amplifier circuit 2030 may be an integral subtracting amplifier circuit.

At this point of time, the first switch SW201 is turned off and the second switch SW202 has made a transition to an on state. The analog signal amplified by the fourth amplifier circuit 2030 is fed back to the third amplifier circuit 2026 and the second AD converter circuit 2027 via the second switch SW202. Assuming that the reference potential of the second AD converter circuit 2027 remains unchanged, the analog signal having a component comprising the higher 7 bits removed from the signal should practically be 8 (2 raised to the 3rd power) times the original, in order to retrieve 3 bits (D5-D3) in the next cycle. For this purpose, the third amplifier circuit 2026 and the fourth amplifier circuit 2030 practically amplify by a factor of 8. The process described above is repeated so that the second AD converter circuit 2027 retrieves the 8th through 10th highest bits (D5-D3) and the 11th through 13th highest bits (D2-D0). With this, a 13-bit digital value is obtained. The 5th through 13th highest bits (D8-D0) are obtained by a cyclic configuration.

In the above, a description is given of an example of setting where the gain of the third amplifier circuit 2026 is 2 and the gain of the fourth amplifier circuit 2030 is 4. Other combinations of the gain are possible. An arbitrary gain may be set as long as the total gain of the third amplifier circuit 2026 and the fourth amplifier circuit 2030 is 8 and the gain of the third amplifier circuit 2026 is equal to or smaller than the gain of the fourth amplifier circuit 2030.

The gain of the first amplifier circuit 2021 and the second amplifier circuit 2025 should be set as follows, to enable the highest speed in a low input voltage operation. The gain of the first amplifier circuit 2021 should be set to a maximum value that permits any input signal in a desired input voltage range to produce an output fitted in the output voltage range of the first amplifier circuit 2021. The gain of the second amplifier circuit 2025 should be set to a value which is responsible for the remainder of the required total gain.

When the second AD converter circuit 2027 converts into 2 bits in a second and subsequent cycles, the required total gain of the third amplifier circuit 2026 and the fourth amplifier circuit 2030 is practically 4 (2 raised to the power of 2).

According to this example, conversion into the higher bits requiring high precision is performed in the preceding stage and conversion into the intermediate to lower bits not requiring high precision is performed in the AD converter circuit of a cyclic type. By setting the gain of the amplifier circuits in the AD conversion part of a cyclic type as described above, the operation speed of the AD converter is improved and the use of a low voltage therein is facilitated, while precision in conversion is preserved.

Third Example of the Second Embodiment

Figure 10:
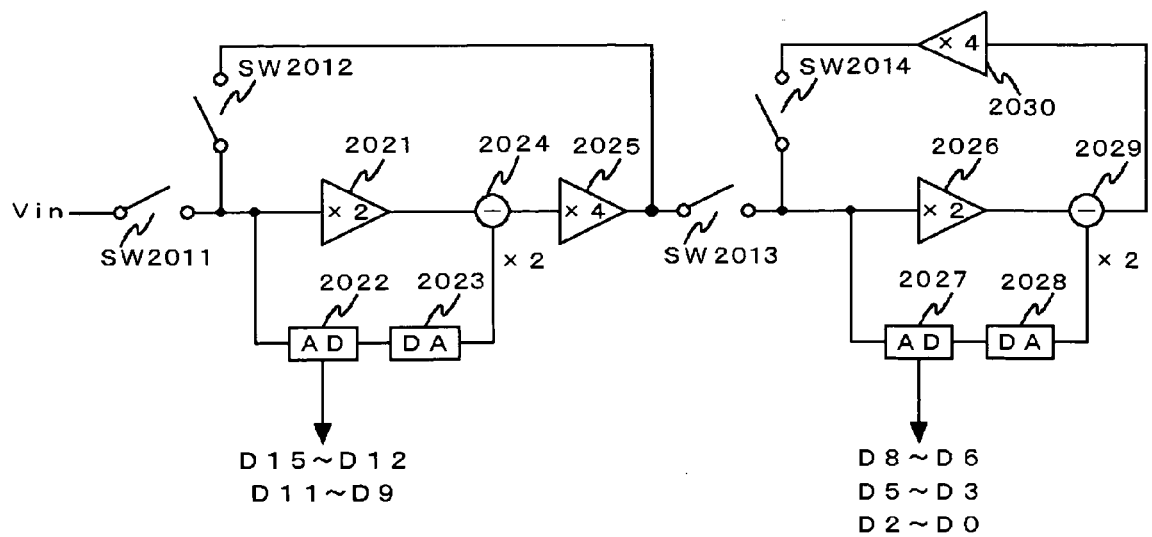
FIG. 10 illustrates the structure of an AD converter according to a third example of the second embodiment.

FIG. 10 illustrates the structure of the AD converter of a pipeline type that includes a plurality of AD conversion stages of a cyclic type according to a third example of the second embodiment. This example provides an AD converter in which, a first AD converter circuit 2022 in the preceding stage first converts into 4 bits and then into 3 bits, and a second AD converter circuit 2027 of a cyclic type in the subsequent stage converts into 3 bits in each of 3 cycles, thus producing a total of 16 bits by conversion.

At an initial stage, a first switch SW2011 is turned on and a second switch SW2012 is turned off. The input analog signal Vin is fed to the first amplifier circuit 2021 and the first AD converter circuit 2022. The first AD converter circuit 2022 converts the input analog signal into a digital value and outputs the higher 4 bits (D15-D12) to the encoder (not shown). The first DA converter circuit 2023 converts the digital value produced by conversion by the first AD converter circuit 2022 into an analog value. The first amplifier circuit 2021 amplifies the input analog signal by a factor of 2 and outputs the signal to the first subtracter circuit 2024 according to a predetermined timing schedule. The first subtracter circuit 2024 subtracts the output of the first DA converter circuit 2023 from the output of the first amplifier circuit 2021. In association with the gain of the first amplifier circuit 2021, the output of the first DA converter circuit 2023 is amplified by a factor of 2. The second amplifier circuit 2025 amplifies the output of the first subtracter circuit 2024 by a factor of 4. The first subtracter circuit 2024 and the second amplifier circuit 2025 may be an integral subtracting amplifier circuit.

At this point of time, the first switch SW2011 is turned off, the second switch SW2012 is turned on, a third switch SW2013 is turned on, and a fourth switch SW2014 has made a transition to an off state. The output analog signal of the second amplifier circuit 2025 is fed to the first amplifier circuit 2021 and the first AD converter circuit 2022 via the second switch SW2012.

In order for the first AD converter circuit 2022 to retrieve 3 bits (D11-D9) in the next cycle, the input thereto should be 8 (2 raised to the 3rd power) times the analog signal input in the preceding cycle. For this purpose, the total gain, which is a product of the gain of the first amplifier circuit 2021 and the gain of the second amplifier circuit 2025, is set to 8. The first AD converter circuit 2022 converts the input analog signal into a digital value again and outputs the 5th through 7th highest bits (D11-D9) of the 16 bits to the encoder (not shown).

Concurrently with this, the analog signal output from the second amplifier circuit 2025 is fed to the third amplifier circuit 2026 and the second AD converter circuit 2027 via the third switch SW2013. The second AD converter circuit 2027 converts the input analog signal into a digital value and outputs the 8th through 10th highest bits (D8-D6) of the 16 bits to the encoder (not shown). The second DA converter circuit 208 converts the digital value produced by conversion by the second AD converter circuit 2027 into an analog value.

The third amplifier circuit 2026 amplifies the input analog signal by a factor of 2 and outputs the amplified signal to a second subtracter circuit 2029. The second subtracter circuit 2029 subtracts the output of the second DA converter circuit 2028 from the output of the third amplifier circuit 2026. In association with the gain of the third amplifier circuit 2026, the output of the second DA converter circuit 2028 is amplified by a factor of 2. The fourth amplifier circuit 2030 amplifies the output of the second subtracter circuit 2029 by a factor of 4. The second subtracter circuit 2029 and the fourth amplifier circuit 2030 may be an integral subtracting amplifier circuit.

At this point of time, the third switch SW2013 is turned off and the fourth switch SW2014 has made a transition to an on state. The analog signal amplified by the fourth amplifier circuit 2030 is fed back to the third amplifier circuit 2026 and the second AD converter circuit 2027 via the fourth switch SW2014. Assuming that the reference potential of the second AD converter circuit 2027 remains unchanged, the analog signal for input thereto should practically be 8 (2 raised to the 3rd power) times the analog signal input in the preceding cycle, in order to retrieve 3 bits (D5-D3) in the next cycle. For this purpose, the total gain, which is a product of the gain of 2 of the third amplifier circuit 2026 and the gain of 4 of the fourth amplifier circuit 2030, is set to 8. The process described above is repeated with the result that the second AD converter circuit 2027 retrieves the 11th through 13th highest bits (D5-D3) and the 14th through 16th highest bits (D2-D0). Thus, the first AD converter circuit 2012 of a cyclic type in the preceding stage retrieves the 1st through 7th highest bits (D15-D9) of the 16 bits, and the second AD converter circuit 2027 of a cyclic type in the subsequent stage retrieves the 8th through 16th bits (D8-D0) of the 16 bits. so as to obtain a digital value of a total of 16 bits.

Described above is an example where the gain of the first amplifier circuit 2021 is set to 2 and that of the second amplifier circuit 2025 is set to 4. Other combinations of the gain are possible. An arbitrary gain may be set as long as the total gain of the first amplifier circuit 2021 and the second amplifier circuit 2025 is 8 and the gain of the first amplifier circuit 2021 is equal to or smaller than the gain of the second amplifier circuit 2025.

The gain of the first amplifier circuit 2011 and the second amplifier circuit 2025 should be set as follows, to enable the highest speed in a low input voltage operation. The gain of the first amplifier circuit 2021 is set to a maximum value that permits any input signal in a desired input voltage range to produce an output fitted in the output voltage range of the first amplifier circuit 2021. The gain of the second amplifier circuit 2025 is set to a value which is responsible for the remainder of the required total gain.

The relation between the gain of the first amplifier circuit 2021 and the gain of the second amplifier circuit 2025 also applies to the gain of the third amplifier circuit 2026 and the gain of the fourth amplifier circuit 2030.

Thus, according to this example, the operation speed of the AD converter of a pipeline type that includes a plurality of cyclic AD conversion stages is improved and the use of a low voltage in the converter is facilitated.

Given above is a description of the second embodiment based on the examples. The description of the embodiment is illustrative in nature and various variations in constituting elements and processes involved are possible. Those skilled in the art would readily appreciate that the variations are also within the scope of the present invention.

The total gain of the first amplifier circuit 2011 (2021) and the second amplifier circuit 2015 (2025) is normally set to be $2^X$, where X is an integer. When the gain of the first amplifier circuit 2011 (2021) is increased by a factor of 2, the gain of the second amplifier circuit 2015 (2025) is decreased by a factor of $2^{X-1}$. When the gain of the first amplifier circuit 2011 (2021) is increased by a factor of 2, the output from the AD/DA converter route should also be increased by a factor of 2. Amplification by a factor of 2 is implemented relatively easily. The relation as described above also applies to the relation between the gain of the third amplifier circuit 2026 and the gain of the fourth amplifier circuit 2030.

Parameters such as the number of bits produced as a result of conversion by the AD converter circuits, allocation of conversion bits, the gain of the amplifier circuits and the number of pipeline stages given in the description above of the examples of the second embodiment are merely by way of example. Other parameter values may be employed in the variations.

Third Embodiment

The art related to the third embodiment will be discussed below. In recent years, a variety of additional functions are built in mobile appliances such as a mobile telephone set, including the image pick-up function, the image playback function, the moving image pick-up function and the moving image playback function. In association with this, there is an increasing demand for miniaturization and power saving of an analog-digital converter (hereinafter, referred to as an AD converter). One mode of AD converter that addresses this demand is known as an AD converter of a cyclic type that cycles through stages (see, for example, the Related art list No. 1). The Related art list No. 1 discloses an AD converter comprising two stages including a cyclic conversion part.

In the cyclic AD converter of FIG. 1 of the Related art list No. 1, the parallel A/D converter AD2 is assigned the task of converting into 3 bits. Therefore, amplification by a high gain of 8 is required before providing a subsequent input to the parallel A/D converter AD2. Since the sample and hold circuit S/H3 provided parallel with the parallel A/D converter 2 does not amplify a signal, amplification by a factor of 8 is required of the subtracter circuit SUB2 and the sample and hold circuit S/H4.

However, the performance of an amplifier circuit is limited by a factor known as gain bandwidth product (GB product). Accordingly, the amplifier circuit constitutes a limiting factor in the speed of operation of the AD converter as a whole. The higher the target gain, the lower the operating frequency of the amplifier and the slower the operation.

The third embodiment will be summarized as follows. The third embodiment has been developed in view of the aforementioned circumstances and its objective is: to improve the operation speed of an AD converter of a cyclic type.

The third embodiment according to one aspect provides an analog-digital converter. The analog-digital converter according to this aspect comprises: an AD converter circuit converting an input analog signal into a digital value of a predetermined number of bits, a DA converter circuit converting an output of the AD converter circuit into an analog signal; a first amplifier circuit provided parallel with the AD converter circuit and amplifying the input analog signal by a first gain; a subtracter circuit subtracting an output of the DA converter circuit, amplified by a gain practically identical to the gain of the first amplifier circuit, from an output of the first amplifier circuit; and a second amplifier circuit amplifying an output of the subtracter circuit by a second gain and feeding the amplified output back to the AD converter circuit, wherein a total gain, which is a product of the first gain and the second gain, represents a required gain, and the first gain is set to a value close to the second gain. For example, the gain of the first amplifier circuit and the gain of the second amplifier circuit may be related to each other such that one is equal to or more than ½ of the other and equal to or less than twice the other.

By setting the gain of the two amplifier circuits constituting the cyclic AD conversion part to be close to each other according to this aspect, amplifier circuits with a large gain are no longer necessary. As a result, the operating frequency, bounded by the factor of GB product, is increased so that operation speed of the amplifier circuit is improved. Accordingly, the operation speed of the AD converter as a whole is improved. The above-mentioned approach also results in the capacitance values used for amplification in the amplifier circuit approaching each other so that balance in capacitance layout is improved.

The first gain and the second gain may be practically identical with each other. By practically matching the gains, the speed of amplification by the two amplifier circuits combined is maximized so that the operation speed of the AD converter as a whole is maximized. This also enables amplifier circuits with the same specification to be used, making circuit design relatively easy and efficient.

The third embodiment according to another aspect also provides an analog-digital converter. The analog-digital converter according to this aspect is an analog-digital converter of a pipeline type comprising a plurality of stages, wherein at least one of the plurality of stages is a cyclic stage that includes the analog-digital converter according to one of the aspects described above.

According to this aspect, precision in conversion into higher bits is improved, and the operation speed of the AD converter as a whole is improved due to the high-speed operation in the cyclic part.

The first gain may be 2. In this setting, the output of the DA converter circuit should be amplified by a factor of 2. Amplification by a factor of 2 is implemented relatively easily. For example, the AD converter circuit may be operated in a single input configuration and the DA converter circuit may provide a differential output. With this, the ratio between the reference voltage range of the AD converter circuit and that of the DA converter circuit is 1:2 so that it is not necessary to create an additional reference voltage.

Arbitrary combinations of the aforementioned constituting elements, and implementations of the third embodiment in the form of methods, apparatus and systems may also be practiced as additional modes of the third embodiment.

Examples of practicing the third embodiment will be described below.

First Example of the Third Embodiment

Figure 11:
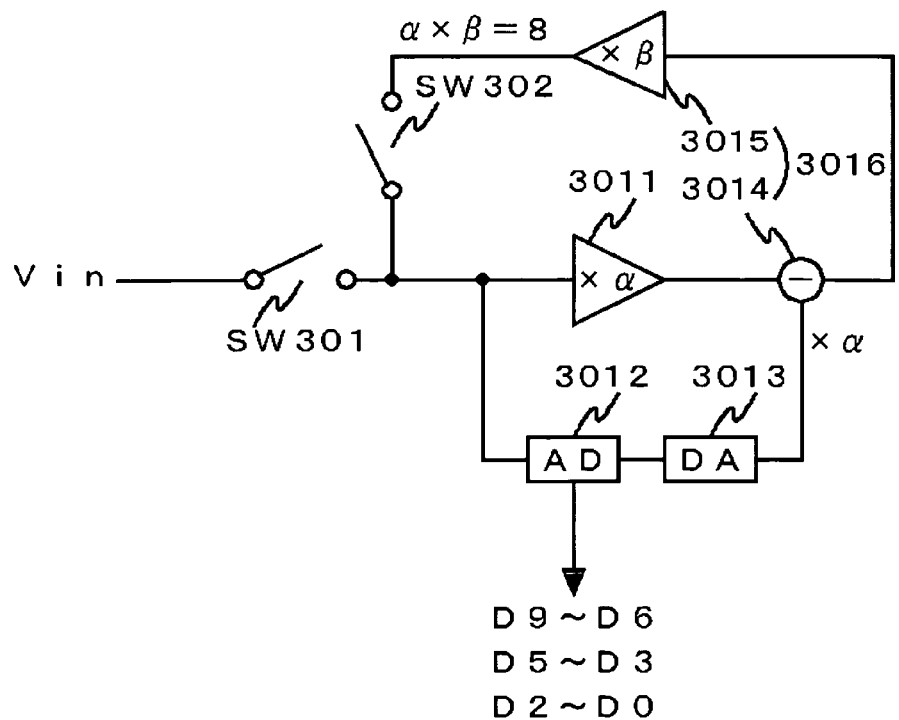
FIG. 11 illustrates the structure of an AD converter according to a first example of a third embodiment.

FIG. 11 illustrates the structure of the AD converter of a cyclic type according to a first example of the third embodiment. The AD converter converts into a digital value comprising a total of 10 bits by going through 3 cycles. At an initial stage, a first switch SW301 is turned on and a second switch SW302 is turned off. The input analog signal Vin is fed to a first amplifier circuit 3011 and an AD converter circuit 3012 via a first switch SW301. The AD converter circuit 3012 converts the input analog signal into a digital value of a maximum of 4 bits and outputs the value to an encoder (not shown). In a first cycle, the higher 4 bits (D9-D6) are output.

The DA converter circuit 3013 converts the digital value of a maximum of 4 bits output from the AD converter circuit 3012 into an analog signal. The first amplifier circuit 3011 samples and amplifies the input analog signal Vin. The gain of the first amplifier 3011 is $\alpha$. The subtracter circuit 3014 subtracts the output of the first DA converter circuit 3013 from the output of the first amplifier circuit 3011. With this, an analog signal having a component comprising the higher 4 bits removed from the signal is generated. The output of the first amplifier circuit 3011 is $\alpha$ times the input analog signal Vin. In association with this, the output of the DA converter circuit 3013 should be multiplied by a factor of $\alpha$.

A description will be given of a method of amplifying the output of the DA converter circuit 3013 by a factor of $\alpha$. The higher reference voltage VRT and the lower reference voltage VRB are supplied to the AD converter circuit 3012 and the DA converter circuit 3013. The AD converter circuit 3012 uses a reference voltage range generated by the higher reference voltage VRT and the lower reference voltage VRB to generate reference voltages. In a capacitor array system, the DA converter circuit 3013 obtains an output voltage by selectively supplying the higher reference voltage VRT and the lower reference voltage VRB to each of a plurality of capacitors (not shown) under the control of the AD converter circuit 3012. The reference voltage range of the DA converter circuit 3013 is also generated based on the higher reference voltage VRT and the lower reference voltage VRB. The reference voltage range of the AD converter circuit 3012 and the reference voltage range of the DA converter circuit 3013 may be set to a ratio of 1:α. For example, given that the gain of the first amplifier circuit 3011 is 2, the reference voltage range of the AD converter circuit 3012 and the reference voltage range of the DA converter circuit 3013 may be set to a ratio of 1:2.

The second amplifier circuit 3015 amplifies the output of the subtracter circuit 3014 by a factor of β. The subtracter circuit 3014 and the second amplifier circuit 3015 may be an integral subtracting amplifier circuit 3016.

At this point of time, the first switch SW301 is turned off and the second switch SW302 has made a transition to an on state. The second amplifier circuit 3015 feeds the amplified signal back to the first amplifier circuit 3011 and the AD converter circuit 3012 via the second switch SW302. Assuming that the reference potential of the AD converter circuit 3012 remains unchanged, the analog signal having a component comprising the higher 4 bits removed the signal should practically be 8 (2 raised to the 3rd power) times the original, in order to retrieve 3 bits (D5-D3) in the next cycle. This means that the total gain, which is a product of the gain α of the first amplifier circuit 3011 and the gain β of the second amplifier circuit 3015, should practically be 8.

The AD converter circuit 3012 outputs the 3 bits (D5-D3) in the second cycle to the encoder (not shown). The DA converter circuit 3013 converts the digital value of 3 bits (D5-D3) output from the AD converter circuit 3012 into an analog signal. Subsequently, the process similar to that of the first cycle is repeated.

To summarize, the first switch SW301 is turned on and the second switch SW302 is turned off in the first stage. The AD converter circuit 3012 converts into the 1st through 4th highest bits (D9-D6) of the 10 bits ultimately produced. In the second and third stages, the first switch SW301 is turned off and the second switch SW302 is turned on. The AD converter circuit 3012 converts into the 5th through 7th highest bits (D5-D3) and the eighth through 10th highest bits (D2-D0) of the 10 bits.

An example of setting the gain α of the first amplifier circuit 3011 and the gain β of the second amplifier circuit 3015 will be described. The gain of the first amplifier circuit 3011 may be set to a value greater than 1. Since the signal output from the first amplifier circuit 3011 is amplified, tolerance for random noise etc. is improved. More specifically, since a large signal is fed to the second amplifier circuit 3015, thermal noise is handled relatively easily. This is because the capacitance for amplification in the second amplifier circuit 3015 becomes relatively small. Since a relatively large signal is fed to the subtracting circuit 3014, requirement for absolute precision in the subtracting circuit 3014 (for example, requirement for noise suppression at a node connected to the switch) is lowered. Moreover, an error in the output signal of the DA converter circuit 3013 causes less severe effects.

The gain of the first amplifier circuit 3011 may be set to 2.5 and the gain of the second amplifier circuit 3015 may be set to 3.2. By setting the gains of the two amplifier circuits such that the gain of one of the amplifier circuits is equal to or more than ½ and equal to or less than twice the gain of the other, amplifier circuits with a large gain are no longer necessary so that the operation speed of the AD converter as a whole is improved. This also enables amplifier circuits with the same specification to be used for the first amplifier circuit 3011 and the second amplifier circuit 3015, making circuit design relatively easy and efficient. The above-mentioned approach also results in the capacitance values used for amplification in the first amplifier circuit 3011 and the second amplifier circuit 3015 approaching each other so that balance in capacitance layout is improved.

The gain of the first amplifier circuit 3011 may be set to 2 and the gain of the second amplifier circuit 3015 may be set to 4. Alternatively, the gain of the first amplifier circuit 3011 may be set to 4 and the gain of the second amplifier circuit 3015 may be set to 4. By setting the gain of the amplifier circuits to be a multiple of 2, circuit design of the first amplifier circuit 3011 and the second amplifier circuit 3015 is made relatively easy and efficient, given that the capacitance values for amplification in the circuits is predetermined. Since the total gain of the first amplifier circuit 3011 and the second amplifier circuit 3015 is 4 in the case of conversion into 2 bits, 8 in the case of conversion into 3 bits, and 16 in the case of conversion into 4 bits, setting the gain of, the amplifier circuits to be a multiple of 2 makes modification relatively easy and circuit design relatively easy and efficient.

The gain of the first amplifier circuit 3011 may be set to $2\sqrt{2}$ and the gain of the second amplifier circuit 3015 may be set to $2\sqrt{2}$. By practically matching the gains of the amplifier circuits, the operation speed of the AD converter as a whole is maximized. This also enables amplifier circuits with the same specification to be used for the first amplifier circuit 3011 and the second amplifier circuit 3015. The above-mentioned approach also results in the same layout of capacitance used in the first amplifier circuit 3011 and in the second amplifier circuit 3015.

Figure 12:
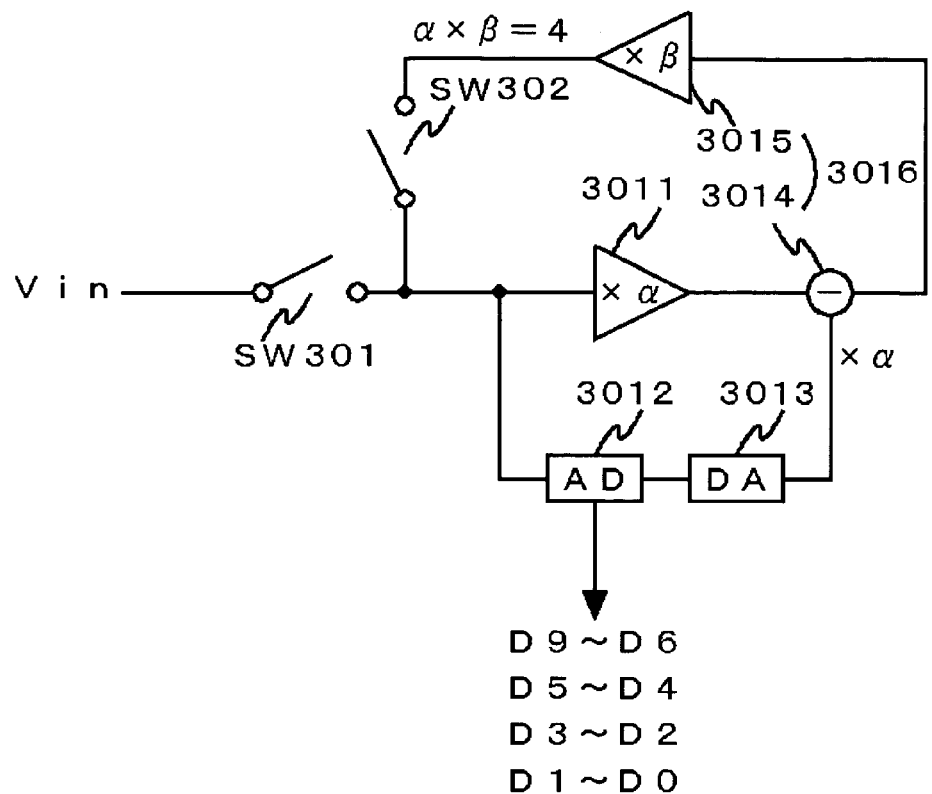
FIG. 12 illustrates the structure of an AD converter according to the first example of the third embodiment with an alternative setting.

FIG. 12 illustrates the structure of the AD converter of a cyclic type according to the first example with an alternative setting. The AD converter converts into a total of 10 bits by going through 4 cycles. When the AD converter circuit 3012 converts into 2 bits in a second and subsequent cycles, the total gain of the first amplifier circuit 3011 and the second amplifier circuit 3015 is 4 instead of 8. The gain α of the first amplifier circuit 3011 and the gain β of the second amplifier circuit 3015 may be arbitrarily set.

Second Example of the Third Embodiment

Figure 13:
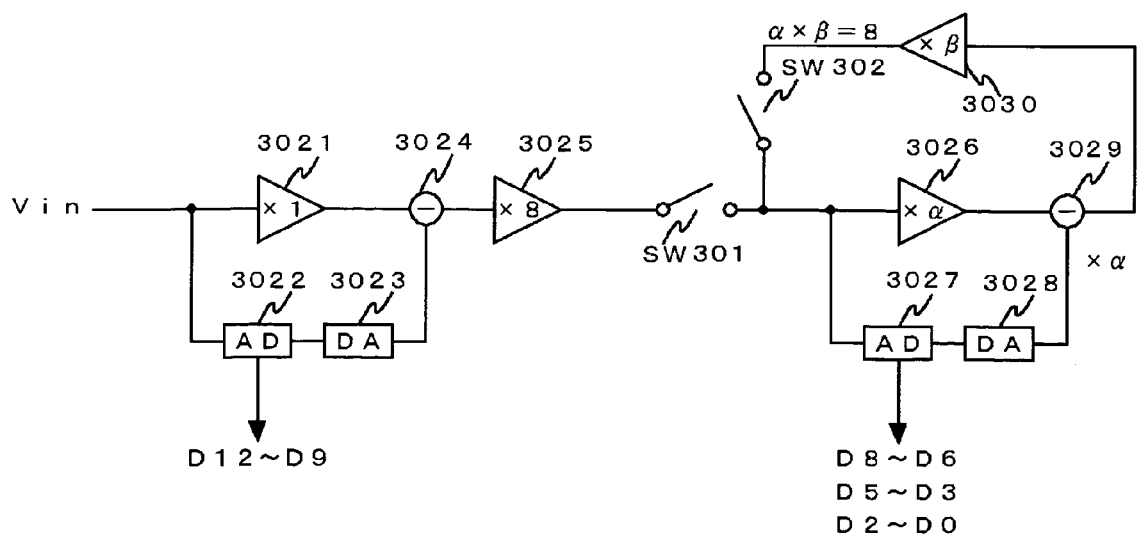
FIG. 13 illustrates the structure of an AD converter according to a second example of the third embodiment.

FIG. 13 illustrates the structure of the AD converter of a pipeline type that includes an AD conversion part of a cyclic type according to a second example of the second embodiment. This example provides an AD converter in which, a first AD converter circuit 3022 in the preceding stage converts into 4 bits and a second AD converter circuit 3027 of a cyclic type in the subsequent stage converts into 3 bits in each of 3 cycles, thus producing a total of 13 bits by conversion.

At an initial stage, a first switch SW301 is turned on and a second switch SW302 is turned off. The input analog signal Vin is fed to the first amplifier circuit 3021 and the first AD converter circuit 3022. The first AD converter circuit 3022 converts the input analog signal into a digital value and outputs the higher 4 bits (D12-D9) to the encoder (not shown). The first DA converter circuit 3023 converts the digital value produced by conversion by the first AD converter circuit 3022 into an analog value. The first amplifier circuit 3021 samples the input analog signal and outputs the signal to the first subtracter circuit 3024 according to a predetermined timing schedule. The first amplifier circuit 3021 does not amplify the analog signal. The first subtracter circuit 3024 subtracts the output of the first DA converter circuit 3023 from the output of the first amplifier circuit 3021. The second amplifier circuit 3025 amplifies the output of the first subtracter circuit 3024 by a factor of 8. The first subtracter circuit 3024 and the second amplifier circuit 3025 may be an integral subtracting amplifier circuit.

The analog signal input via the first switch SW301 is fed to a third amplifier circuit 3026 and a second AD converter circuit 3027. The second AD converter circuit 3027 converts the input analog signal into a digital value and outputs the 5th through 7th highest bits (D8-D6) to the encoder (not shown). A second DA converter circuit 3028 converts the digital value produced by conversion by the second AD converter circuit 3027 into an analog value.

The third amplifier circuit 3026 amplifies the input analog signal by a factor of α and outputs the amplified signal to a second subtracter circuit 3029. The second subtracter circuit 3029 subtracts the output of the second DA converter circuit 3028 from the output of the third amplifier circuit 3026. The output of the second DA converter circuit 3028 is amplified by a factor of α. A fourth amplifier circuit 3030 amplifies the output of the second subtracter circuit 3029 by a factor of β. The second subtracter circuit 3029 and the fourth amplifier circuit 3030 may be an integral subtracting amplifier circuit.

At this point of time, the first switch SW301 is turned off and the second switch SW302 has made a transition to an on state. The analog signal amplified by the fourth amplifier circuit 3030 is fed back to the third amplifier circuit 3026 and the second AD converter circuit 3027 via the second switch SW302. Assuming that the reference potential of the second AD converter circuit 3027 remains unchanged, the analog signal having a component comprising the higher 7 bits removed from the signal should practically be 8 (2 raised to the 3rd power) times the original, in order to retrieve 3 bits (D5-D3) in the next cycle. This means that the total gain, which is a product of the gain α of the third amplifier circuit 3026 and the gain β of the fourth amplifier circuit 3030, should practically be 8. The process described above is repeated with the result that the second AD converter circuit 3027 retrieves the 8th through 10th highest bits (D5-D3) and the 11th through 13th highest bits (D2-D0). With this, a 13-bit digital value is obtained. The 5th through 13th highest bits (D8-D0) are obtained by a cyclic configuration.

A description will be given of an example of setting the gain α of the third amplifier circuit 3026 and the gain β of the fourth amplifier circuit 3030. The gain of the third amplifier circuit 3026 may be set to a value greater than 1. The gains of the amplifier circuits may be set such that the gain of one of the amplifier circuits is equal to or more than ½ and equal to or less than twice the gain of the other. For example, the gain of the third amplifier circuit 3026 may be set to 2.5 and the gain of the fourth amplifier circuit 3030 may be set to 3.2. The gain of the amplifier circuits may be set to be a multiple of 2. For example, the gain of the third amplifier circuit 3026 may be set to 2, and the gain of the fourth amplifier circuit 3030 to 4. Alternatively, the gain of the third amplifier circuit 3026 may be set to 4, and the gain of the fourth amplifier circuit 3030 to 2. The amplifier circuits may be configured to have the identical gain. For example, the gain of the third amplifier circuit 3026 may be set to $2\sqrt{2}$ and the gain of the fourth amplifier circuit 3030 may be set to $2\sqrt{2}$. The beneficial effects provided by these settings are the same as those described in the first example.

Referring to FIG. 13, the gain of the first amplifier circuit 3021, may be set to 2 and the gain of the second amplifier circuit 3025 may be set to 4. With this, the operation speed in the preceding stage is improved so that the input to the second AD converter circuit 3027 occurs earlier than otherwise. By setting the reference voltage of the second AD converter circuit 3027 to ½ of the reference voltage of the first AD converter circuit 3022, the gain of the second amplifier circuit 3025 can be set to 2, enabling an even higher operation speed.

According to this example, conversion into the higher bits requiring high precision is performed in the preceding stage and conversion into the intermediate to lower bits not requiring high precision is performed in the AD converter circuit of a cyclic type. By setting the gain of the amplifier circuits in the AD converter as described above, the operation speed of the AD converter as a whole is improved and precision in conversion is improved. The beneficial effects including the ease and efficiency in circuit design, as described in the first example of the third embodiment, are also provided.

Third Example of the Third Embodiment

Figure 14:
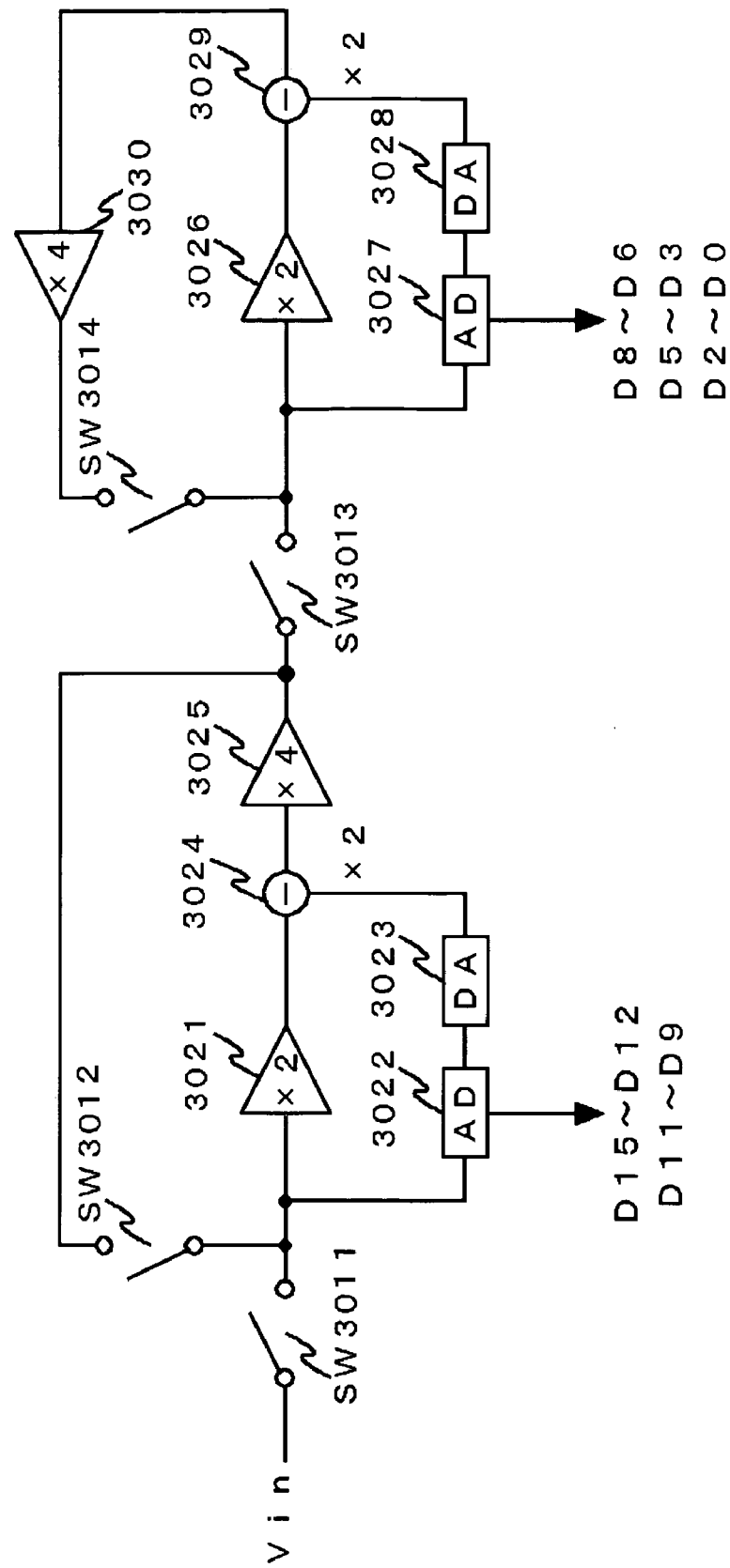
FIG. 14 illustrates the structure of an AD converter according to a third example of the third embodiment.

FIG. 14 illustrates the structure of an AD converter of a pipeline type that includes a plurality of AD conversion parts of a cyclic type according to a third example of the third embodiment. This example provides an AD converter in which, a first AD converter circuit 3022 in the preceding stage first converts into 4 bits and then into 3 bits, and a second AD converter circuit 3027 of a cyclic type in the subsequent stage converts into 3 bits in each of 3 cycles, thus producing a total of 16 bits by conversion.

At an initial stage, a first switch SW3011 is turned on and a second switch SW3012 is turned off. The input analog signal Vin is fed to the first amplifier circuit 3021 and the first AD converter circuit 3022. The first AD converter circuit 3022 converts the input analog signal into a digital value and outputs the higher 4 bits (D15-D12) to the encoder (not shown). The first DA converter circuit 3023 converts the digital value produced by conversion by the first AD converter circuit 3022 into an analog value. The first amplifier circuit 3021 amplifies the input analog signal by a factor of 2 and outputs the signal to the first subtracter circuit 3024 according to a predetermined timing schedule. The first subtracter circuit 3024 subtracts the output of the first DA converter circuit 3023 from the output of the first amplifier circuit 3021. The output of the second DA converter circuit 3023 is amplified by a factor of 2. The second amplifier circuit 3025 amplifies the output of the first subtracter circuit 3024 by a factor of 4. The first subtracter circuit 3024 and the second amplifier circuit 3025 may be an integral subtracting amplifier circuit.

At this point of time, the first switch SW3011 is turned off, the second switch SW3012 is turned on, a third switch SW3013 is turned on, and a fourth switch SW3014 has made a transition to an off state. The output analog signal of the second amplifier circuit 3025 is fed to the first amplifier circuit 3021 and the first AD converter circuit 3022 via the second switch SW3012.

In order for the first AD converter circuit 3022 to retrieve 3 bits (D11-D9) in the next cycle, the input thereto should be 8 (2 raised to the 3rd power) times the analog signal input in the preceding cycle. For this purpose, the total gain, which is a product of the gain of the first amplifier circuit 3021 and the gain of the second amplifier circuit 3025, is set to 8. The first AD converter circuit 3022 converts the input analog signal into a digital value and outputs the 5th through 7th highest bits (D11-D9) of the 16 bits to the encoder (not shown).

Concurrently with this, the analog signal output from the second amplifier circuit 3025 is fed to the third amplifier circuit 3026 and the second AD converter circuit 3027 via the third switch SW3013. The second AD converter circuit 3027 converts the input analog signal into a digital value and outputs the 8th through 10th highest bits (D8-D6) of the 16 bits to the encoder (not shown). The second DA converter circuit 3028 converts the digital value produced by conversion by the second AD converter circuit 3027 into an analog value.

The third amplifier circuit 3026 amplifies the input analog signal by a factor of 2 and outputs the amplified signal to the second subtracter circuit 3029. The second subtracter circuit 3029 subtracts the output of the second DA converter circuit 3028 from the output of the third amplifier circuit 3026. The output of the second DA converter circuit 3028 is amplified by a factor of 2. The fourth amplifier circuit 3030 amplifies the output of the second subtracter circuit 3029 by a factor of 4. The second subtracter circuit 3029 and the fourth amplifier circuit 3030 may be an integral subtracting amplifier circuit.

At this point of time, the third switch SW3013 is turned off and the fourth switch SW3014 has made a transition to an on state. The analog signal amplified by the fourth amplifier circuit 3030 is fed back to the third amplifier circuit 3026 and the second AD converter circuit 3027 via the fourth switch SW3014. Assuming that the reference potential of the second AD converter circuit 3027 remains unchanged, the input thereto should practically be 8 (2 raised to the 3rd power) times the analog signal input in the preceding cycle, in order to retrieve 3 bits (D5-D3) in the next cycle. For this purpose, the total gain, which is a product of the gain of the third amplifier circuit 3026 and the gain of the fourth amplifier circuit 3030, is set to 8. The process described above is repeated with the result that the second AD converter circuit 3027 retrieves the 11th through 13th highest bits (D5-D3) and the 14th through 16th highest bits (D2-D0) Thus, the first AD converter circuit 3012 of a cyclic type in the preceding stage retrieves the 1st through 7th highest bits (D15-D9) of the 16 bits, and the second AD converter circuit 3027 of a cyclic type in the subsequent stage retrieves the 8th through 16th bits (D8-D0) of the 16 bits, thus producing a total of 16 bits.

Described above is an example where the gain of the first amplifier circuit 3021 is set to 2 and that of the second amplifier circuit 3025 is set to 4. The gain of the first amplifier circuit 3021 may be set to 4 and the gain of the second amplifier circuit 3025 may be set to 2. According to these settings, each of the gains of the amplifier circuits is set to a multiple of 2. The gains of the amplifier circuits may be set such that the gain of one of the amplifier circuits is equal to or more than ½ and equal to or less than twice the gain of the other. For example, the gain of the first amplifier circuit 3021 may be set to 2.5 and the gain of the second amplifier circuit 3025 may be set to 3.2. The amplifier circuits may be configured to have the identical gain. For example, the gain of the first amplifier circuit 3021 may be set to $2\sqrt{2}$ and the gain of the second amplifier circuit 3025 may be set to $2\sqrt{2}$. The beneficial effects as described in the first example of the third embodiment are also provided. The gain of the first amplifier circuit 3021 may be set to a value greater than 1 to provide the effect of high-speed operation. The relation between the gain of the first amplifier circuit 3021 and the gain of the second amplifier circuit 3025 also applies to the gain of the third amplifier circuit 3026 and the gain of the four th amplifier circuit 3030.

Thus, the example described above achieves a high-speed operation of the AD converter of a pipeline type that includes a plurality of AD conversion stages of a cyclic type. The beneficial effects including the ease and efficiency in circuit design, as described in the first example of the third embodiment, are also provided.

Described above is a description of the third embodiment based on the examples. The description of the embodiment is illustrative in nature and various variations in constituting elements and processes involved are possible. Those skilled in the art would readily appreciate that the variations are also within the scope of the present invention.

The total gain of the first amplifier circuits 3011 (3021) and the second amplifier circuit 3015 (3025) is normally set to be 2X, where X is an integer. When the gain of the first amplifier circuit 3011 (3021) is increased by a factor of 2, the gain of the second amplifier circuit 3015 (3025) is decreased by a factor of 2X−1. When the gain of the first amplifier circuit 3011 (3021) is increased by a factor of 2, the output from the AD/DA converter route should also be increased by a factor of 2. Amplification by a factor of 2 is implemented relatively easily. The relation as described above also applies to the relation between the gain of the third amplifier circuit 3026 and the gain of the fourth amplifier circuit 3030.

Parameters such as the number of bits produced as a result of conversion, allocation of conversion bits, the gain of the amplifier circuits and the number of pipeline stages given in the description above of the examples of the third embodiment are merely by way of example. Other parameter values may be employed in the variations.

Fourth Embodiment

The art related to the fourth embodiment will be discussed below. In recent years, a variety of additional functions are built in mobile appliances such as a mobile telephone set, including the image pick-up function, the image playback function, the moving image pick-up function and the moving image playback function. In association with this, there is an increasing demand for miniaturization, high precision, high speed and power saving of an analog-digital converter (hereinafter, referred to as an AD converter). One mode of AD converter that addresses this demand is known as an AD converter in which miniaturization is achieved by subjecting an analog signal to conversion in a plurality of discrete stages and providing cyclic stages for this purpose (see, for example, the Related art list No. 1).

Referring to FIG. 1 of the Related art list No. 1, the subtracter circuit SUB1 provided with the sample and hold circuit S/H1 and the amplifying function is provided in the preceding stage. In the subsequent stage, the subtracter circuit SUB 2 provided with the sample and hold circuit S/H3, the sample and hold circuit S/H4 and the amplifying function is provided in the subsequent stage. The gain of the sample and hold circuit S/H1 and that of the sample and hold circuit S/H3 are 1. In such a case, it is assumed that similar circuits are used in the sample and hold circuit S/H1 and in the sample and hold circuit S/H3.

In an AD converter circuit such as that described with reference to FIG. 1 of the Related art list No. 1, in which AD conversion is performed in a plurality of stages, requirement for precision in the analog signal transmitted becomes less severe as the AD conversion proceeds from higher bits to lower bits. Accordingly, when amplifier circuits, including sample and hold circuits, with the same gain are built with the same circuit configuration, the configuration of the amplifier circuit required to provide the highest precision will also be used in other amplifier circuits with less severe requirement, with the result that a problem of over designed system occurs.

The fourth embodiment will be summarized as follows. The fourth embodiment has been developed in view of the above-mentioned circumstances and its objective is to do without an over designed system and to design an AD converter efficiently.

The fourth embodiment according to one aspect provides an analog-digital converter. The analog-digital converter according to this aspect is an analog-digital converter converting an input analog signal into a digital signal of a plurality of bits in a plurality of stages, comprising a plurality of amplifier circuits, wherein two or more of the amplifier circuits with practically the same gain are differently designed in respect of at least one of a circuit constant and a circuit configuration.

The plurality of amplifier circuits of an analog-digital converter of a pipe line type or a cyclic type which converts into a digital signal of a plurality of bits in a plurality of stages are not required to provide uniform precision. The amplifier adapted for relatively higher bits are required to provide relatively higher precision. The requirement for precision becomes less severe as the conversion proceeds to lower bits. According to this aspect of the embodiment, each of amplifier circuits with practically the same gain is designed such that at least one of the circuit constant and the circuit configuration thereof is selected from different optional specifications. In this way, the amplifier required to provide high precision is designed such that at least one of the circuit constant and the circuit configuration thereof is of a higher specification, and the amplifier not required to so high a precision is designed such that that at least one of the circuit constant and the circuit configuration thereof is of a lower specification. Accordingly, reduction in power consumption and miniaturization are achieved while preserving precision so that the AD converter as a whole is efficiently designed. The phrase "practically the same gain" includes a case where the design specifications for ideal performance of amplifier circuits are identical but the gain thereof in actual performance differs from circuit to circuit. The term "amplifier circuit" also refers to a circuit for amplification by a factor of 1, i.e. a sample and hold circuit.

At least one of the circuit constant and the circuit configuration of the amplifier circuit which first receives an input analog signal may be of a higher specification than the corresponding specification of the other amplifier circuits. With this, precision of the amplifier handling the largest signal can be improved. At least one of the circuit constant and the circuit configuration of an amplifier circuit, upstream in a plurality of amplifier circuits transmitting an input analog signal, is of a higher specification than that of the amplifier circuits downstream in the order of transmission. According to this approach, the converter can be more efficiently designed by taking advantage of the fact that requirement for precision becomes less severe as the conversion proceeds from higher bits to lower bits. The phrase "higher specification" includes an improvement in precision or operation speed of an amplifier.

The plurality of amplifier circuits may include an operational amplifier as a constituting element. The circuit configuration of the operational amplifier may differ between the amplifier circuits with practically the same gain. Precision of amplifier circuit can be adjusted by controlling the number of transistors constituting the operational amplifier, the mode of connection, the specification of transistors, the power supply voltage etc, to ensure that the AD converter as a whole can be efficiently designed.

Each of the plurality of amplifier circuits is embodied by a switched capacitor operational amplifier. The switched capacitor operational amplifier includes an operational amplifier, at least one first capacitance connected to an input terminal of the operational amplifier and at least one second capacitance connected between the input terminal and an output terminal of the operational amplifier. The values of the first capacitance and the second capacitance differ between amplifiers with practically the same gain. By increasing the value of the first capacitance and the second capacitance, which are circuit constants of the operational amplifier, thermal noise due to the resistance component of a switch preceding the first capacitance is reduced. By adjusting the values of the first capacitance and the second capacitance of each of the amplifier circuits, it is ensured that the AD converter as a whole is efficiently designed. Each of the first capacitance and the second capacitance may be implemented by a plurality of capacitors.

The converter according to this embodiment may include a plurality of stages converting an input analog signal into a digital value of a predetermined number of bits. At least one of the plurality of stages may include an amplifier circuit selected from the plurality of amplifier circuits. The amplifier circuit may amplify a difference between the input analog signal and a signal derived by conversion from the digital value, obtained by analog-to-digital conversion in the stage in which the amplifier circuit is provided, into an analog signal, and feed back the amplified difference to an input of the stage. By allowing an arbitrary selection of at least one of the circuit constant and the circuit configuration of the amplifier circuit in an AD converter which comprises a plurality of stages and which is provided with a cyclic stage designed for one-step amplification, it is ensured that the AD converter as a whole is efficiently designed.

The converter according to this embodiment may include a plurality of stages converting an input analog signal into a digital value of a predetermined number of bits. At least one of the plurality of stages may includes two amplifier circuits selected from the plurality of amplifier circuits. A first amplifier circuit of the two amplifier circuits may amplify the input analog signal by a first predetermined gain, and a second amplifier circuit of the two amplifier circuits may amplify, by a second predetermined gain, a difference between an analog signal output from the first amplifier circuit and a signal derived by conversion from the digital value, obtained by analog-to-digital conversion in a stage in which the second amplifier circuit is provided, into an analog signal amplified by practically the same gain as said first predetermined gain, and feedback the amplified difference to an input of the stage. By allowing an arbitrary selection of at least one of the circuit constant and the circuit configuration of the amplifier circuit in an AD converter of a pipeline type which comprises a plurality of stages and which is provided with a cyclic stage designed for two-step amplification, it is ensured that the AD converter as a whole is efficiently designed. The term "first amplifier circuit" also refers to a circuit for amplification by a factor of 1, i.e. a sample and hold circuit.

The AD converter may include an AD converter circuit converting an input analog signal into a digital value of a predetermined number of bits, and a DA converter circuit converting an output of the AD converter circuit into an analog signal. A first amplifier circuit of the plurality of amplifier circuits may amplify the input analog signal by a predetermined gain, and a second of a plurality of amplifier circuits may amplify a difference between an analog signal output from the first amplifier circuit and an analog signal output from the DA converter circuit, amplified by practically the same gain as the first amplifier circuit, and output the amplified difference to the AD converter circuit and the first amplifier circuit. By allowing an arbitrary selection of at least one of the circuit constant and the circuit configuration of the amplifier circuit in an AD converter of a cyclic type, it is ensured that the AD converter as a whole is efficiently designed. The term "amplifier circuit" also refers to a circuit for amplification by a factor of 1, i.e. a sample and hold circuit.

Arbitrary combinations of the aforementioned constituting elements, and implementations of the fourth embodiment in the form of methods, apparatus and systems may also be practiced as additional modes of practicing the fourth embodiment.

First Example of the Fourth Embodiment

A first example of the fourth embodiment provides an AD converter in which a preceding stage of a non-cyclic type converts into 4 bits and a subsequent stage of a cyclic type converts into 2 bits in each cycle. By allowing the subsequent stage to go through 3 cycles, a total of 10 bits are output.

Figure 15:
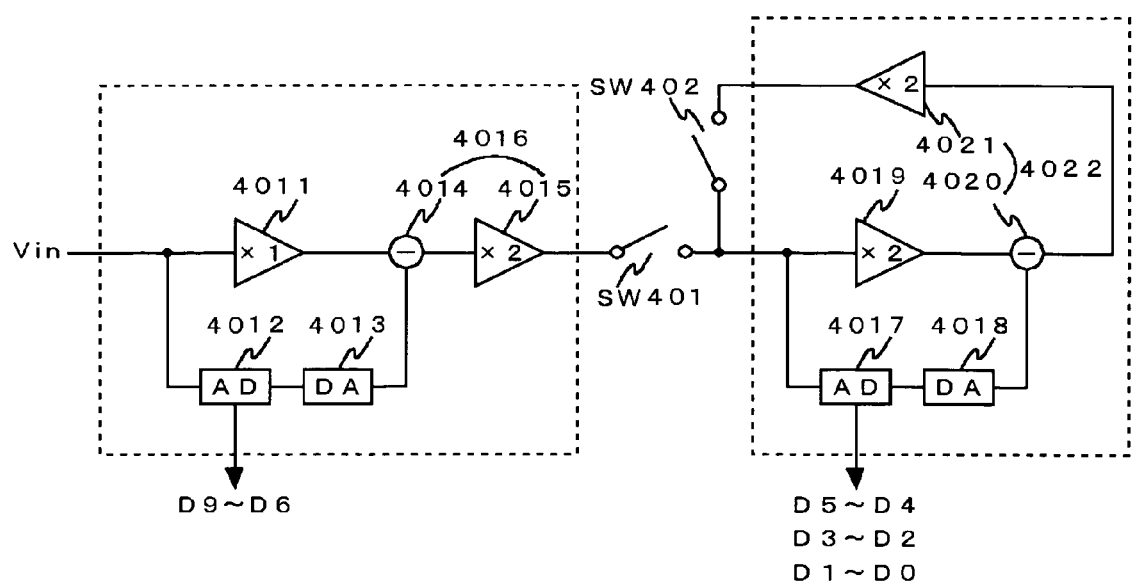
FIG. 15 illustrates the structure of an AD converter according to a first example of a fourth embodiment of the present invention.

FIG. 15 illustrates the structure of an AD converter according to the first example of the fourth embodiment. A description will be given of the preceding stage of the AD converter. The input analog signal Vin is fed to a first amplifier circuit 4011 and a first AD converter circuit 4012. The first AD converter circuit 4012 is of a flash type and the resolution thereof, i.e. the number of bits produced by conversion therein, is 4 bits. The first AD converter circuit 4012 converts the input analog signal into a digital value, retrieves the higher 4 bits (D9-D6) and outputs the bits to the encoder (not shown) and a first DA converter circuit 4013. The first DA converter circuit 4013 converts the digital value produced by conversion by the first AD converter circuit 4012 into an analog value. The first amplifier circuit 4011 samples and holds the input analog signal and outputs the signal to a first subtracter circuit 4014 according to a predetermined timing schedule. The first amplifier circuit 4011 does not amplify the analog signal and functions as a sample and hold circuit. The first subtracter circuit 4014 subtracts the output of the first DA converter circuit 4013 from the output of the first amplifier circuit 4011. A second amplifier circuit 4015 amplifies the output of the first subtracter circuit 4014 by a factor of 2. The subtracter circuit 4014 and the second amplifier circuit 4015 may be an integral subtracting amplifier circuit 4016. With this, the circuit can be simplified.

A description will now be given of the subsequent stage. A first switch SW401 and a second switch SW402 are alternately turned on and off. The analog signal input via the first switch SW401 when the first switch SW401 is turned on and the second switch SW402 is turned off is fed to a third amplifier circuit 4019 and a second AD converter circuit 4017. The second AD converter circuit 4017 is of a flash type and the resolution thereof, i.e. the number of bits produced, including the redundant 1 bit, is 4 bits. The reference voltage supplied to voltage comparison elements constituting the second AD converter circuit 4017 is set to ½ of the reference voltage supplied to voltage comparison elements constituting the first AD converter circuit 4012. In order for the second AD converter circuit 4017 to convert into 2 bits, the analog signal subjected to the conversion in the first AD converter circuit 4012 should practically be amplified by a factor of 4 (2 raised to the 2nd power). Since the gain of the second amplifier circuit 4015 is 2, the reference voltage is set to ½ for adjustment. The second AD converter circuit 4017 converts the input analog signal into a digital value, retrieves the 5th through 6th highest bits (D5-D4) and outputs the bits to the encoder (not shown) and a second DA converter circuit 4019. The second DA converter circuit 4018 converts the digital value produced by conversion by the second AD converter circuit 4017 into an analog value.

The third amplifier circuit 4019 amplifies the input analog signal by a factor of 2 and outputs the amplified signal to a second subtracter circuit 4020. The second subtracter circuit 4020 subtracts the output of the second DA converter circuit 4019 from the output of the third amplifier circuit 4019 and outputs the result to a fourth amplifier circuit 4021. The output of the second DA converter circuit 4018 is practically amplified by a factor of 2. Amplification by a factor of 2 is implemented by setting the ratio between the reference voltage range of the second AD converter circuit 4017 and the reference voltage range of the second DA converter circuit 4018 to 1:2. For example, the ratio can be set to 1:2 by configuring the second AD converter circuit 4017 as a single input circuit and the second DA converter circuit 4018 as a differential output circuit.

The fourth amplifier circuit 4021 amplifies the output of the second subtracter circuit 4020 by a factor of 2. At this point of time, the first switch SW401 is turned off and the second switch SW402 has made a transition to an on state. The analog signal amplified by the fourth amplifier circuit 4021 is fed back to the third amplifier circuit 4019 and the second AD converter circuit 4017 via the second switch SW402. The second subtracter circuit 4020 and the fourth amplifier circuit 4021 may be a second subtracting amplifier circuit 4022 of an integral type. The process described above is repeated with the result that the second AD converter circuit 4017 retrieves the 7th through 8th highest bits (D3-D2) and the 9th through 10th highest bits (D1-D0) With this, a 10-bit digital value is obtained. The 5th through 10th highest bits are obtained by the subsequent stage of a cyclic type.

Figure 16:
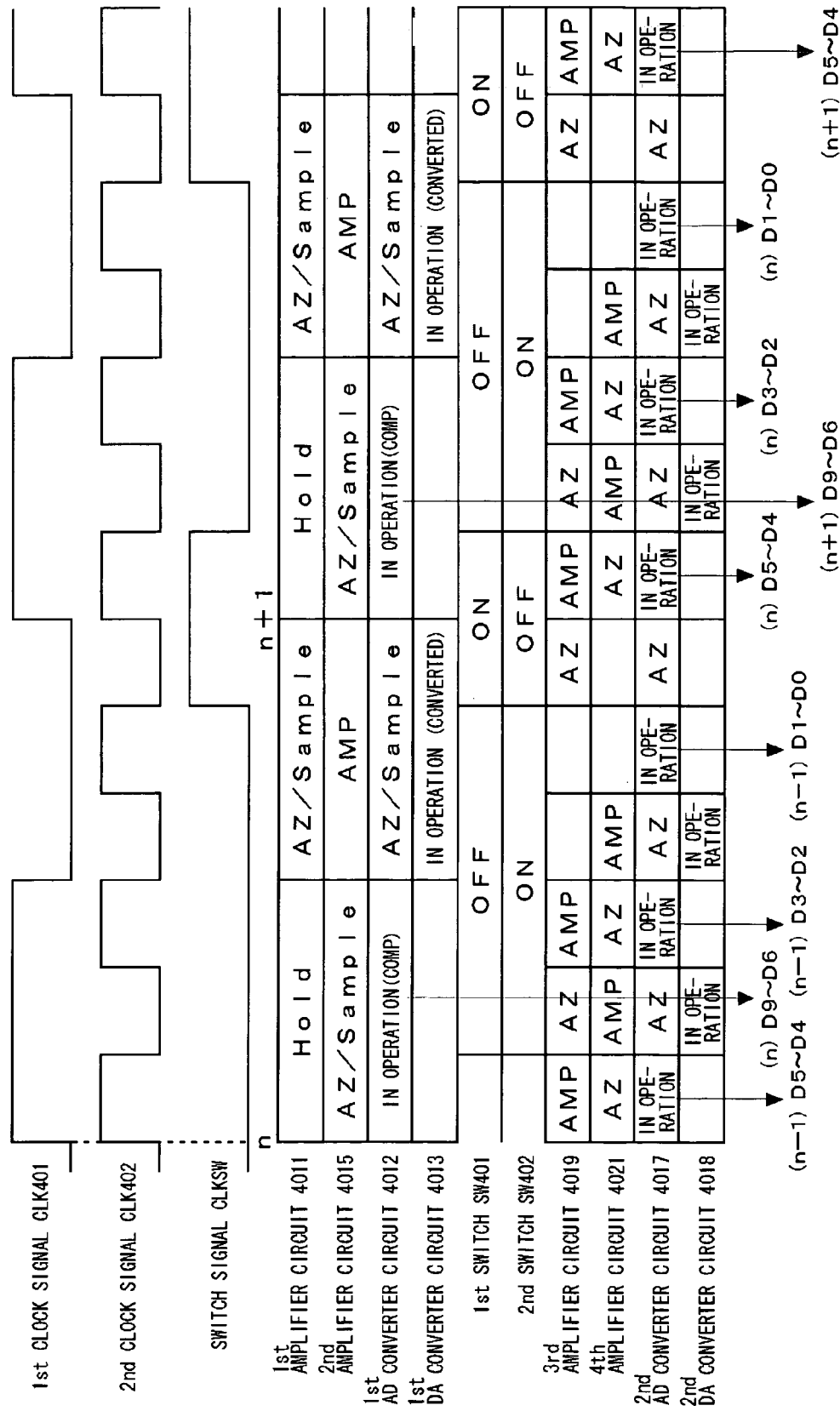
FIG. 16 is a time chart showing the operating process of an AD converter according to the first example of the fourth embodiment.

FIG. 16 is a time chart illustrating the operating process of the AD converter according to the first example of the fourth embodiment. The process will be described from the top of the figure downward. Three waveforms at the top are for a first clock signal CLK1, a second clock signal CLK2 and a switch signal CLKSW in the illustrated order. The first clock signal CLK1 controls the operation of the first amplifier circuit 4011, the second amplifier circuit 4015, the first AD converter circuit 4012 and the first DA converter circuit 4013. The second clock signal CLK2 controls the operation of the third amplifier circuit 4019, the fourth amplifier circuit 4021, the second AD converter circuit 4017 and the second DA converter circuit 4018. The switch signal CLKSW effects on/off control of the first switch SW401 and the second switch SW402.

The frequency of the second clock signal CLK2 is three times that of the first clock signal CLK2. The second clock signal CLK2 may be generated by multiplying the first clock signal CLK1 using a PLL or the like. A rising edge of the second clock signal CLK2 is synchronized with a rising edge of the first clock signal CLK1. Subsequently, a third falling edge of the second clock signal CLK2 is synchronized with a second falling edge of the first clock signal CLK1. Further, a fourth rising edge of the second clock signal CLK2 is synchronized with a second rising edge of the first clock signal CLK1. Since the frequency of the second clock CLK2 is three times that of the first clock signal CLK1, the conversion speed in the subsequent stage is three times that of the conversion speed in the preceding stage. Analog processes such as subtraction and amplification for conversion into relatively higher bits largely affect overall precision in conversion. Therefore, the preceding stage responsible for conversion into relatively higher bits is required to provide high precision. In this respect, it is possible to increase the speed of operation in the subsequent stage as compared to the preceding stage, since the subsequent stage is not required to provide precision as high as that required in the preceding stage.

The first amplifier circuit 4011 and the first AD converter circuit 4012 sample the input analog signal Vin at a rising edge of the first clock signal CLK1. The first amplifier circuit 4011 holds the sampled analog signal when the first clock signal CLK1 is high and is placed in an autozero operation mode when the first clock signal CLK1 is low. The second amplifier circuit 4015 samples the input analog signal at a falling edge of the first clock signal CLK1. When the first clock signal CLK1 is low, the second amplifier circuit 4015 amplifies the sampled analog signal and outputs the amplified signal to the third amplifier circuit 4019 and the second AD converter circuit 4017. When the first clock signal CLK1 is high, the second amplifier circuit 4015 is placed in an autozero operation mode. The first AD converter circuit 4012 converts into a digital value comprising the D9-D6 bits when the first clock signal CLK1 is high, and is placed in an autozero operation mode when the first clock signal CLK1 is low. The first DA converter circuit 4013 holds the converted data when the first clock signal CLK1 is low, and is in an unstable state when the first clock signal CLK1 is high.

The first switch SW401 is turned on when the switch signal CLKSW is high and turned off when the switch signal CLKSW is low. The second switch SW402 is turned on when the switch signal CLKSW is low and turned off when the switch signal CLKSW is high.

The third amplifier circuit 4019 and the second AD converter circuit 4017 sample the input analog signal at a rising edge of the second clock signal CLK2. The third amplifier circuit 4019 amplifies the sampled analog signal when the second clock signal CLK2 is high and is placed in an autozero operation mode when the second clock signal CLK2 is low. The third amplifier circuit 4019 does not amplify while the second AD converter circuit 4017 converts into the lowest bits D1-D0. The fourth amplifier circuit 4021 samples the input analog signal at a falling edge of the second clock signal CLK2. The fourth amplifier circuit 4021 amplifies the sampled analog signal when the second clock signal CLK2 is low and is placed in an autozero operation mode when the second clock signal CLK2 is low. Amplification is not performed during the subsequent half-clock period after the second AD converter circuit 4017 converted into the bits D1-D0.

When the second clock signal CLK2 is high, the second AD converter circuit 4017 converts into 2 bits, with redundant bits being eliminated. The second AD converter 4017 is placed in an autozero operation mode when the second clock signal CLK2 is low. The second DA converter circuit 4018 holds the converted data when the second clock signal CLK2 is low and is in an unstable state when the second clock signal CLK2 is high. Conversion is not performed when the second AD converter circuit 4017 outputs the bits D1-D0.

In an autozero period of the first amplifier circuit 4011, the second amplifier circuit 4015, the third amplifier circuit 4019, the fourth amplifier circuit 4021, the first AD converter circuit 4012 and the second AD converter circuit 4017, the input signal is being sampled. As shown, concurrently with the conversion by the second AD converter circuit 4017 into D5-D4 and D3-D2, the first AD converter circuit 4012 converts from a subsequently input analog signal Vin. According to the pipeline process as described above, the AD converter as a whole is capable of outputting a digital value of 10 bits once in a cycle defined by the first clock signal CLK1.

Figure 17:
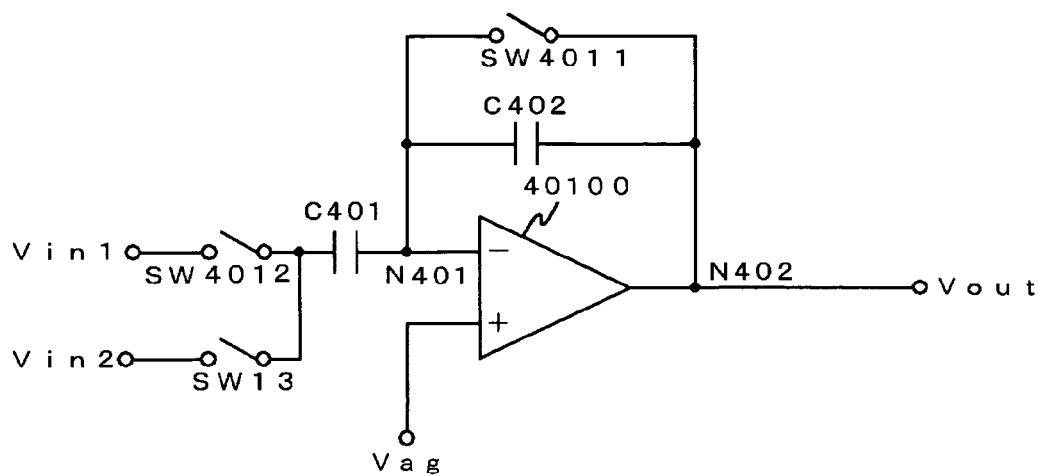
FIG. 17 illustrates the structure of a single-ended switched capacitor operational amplifier according to the fourth embodiment.
Figure 18:
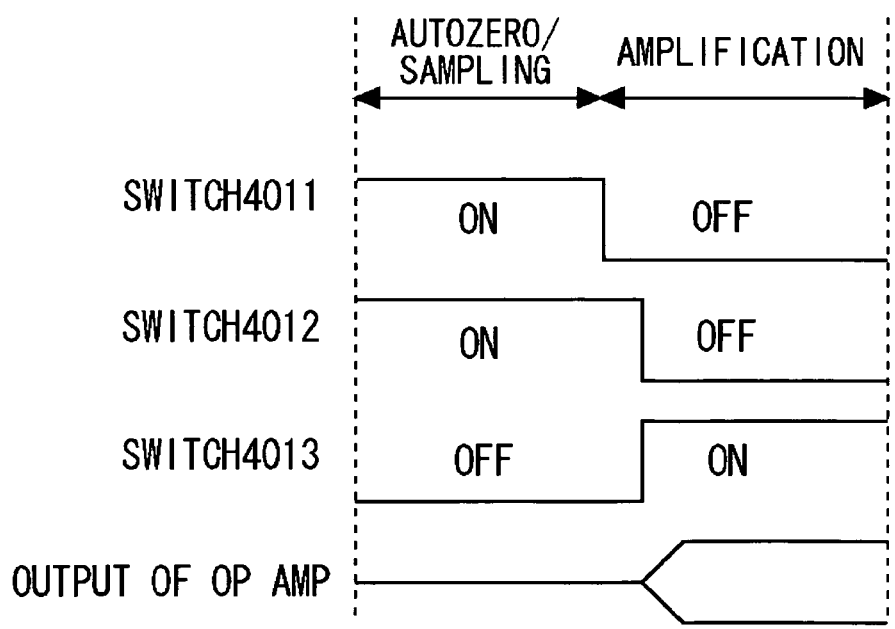
FIG. 18 is a time chart showing the operation of the switched capacitor operation amplifier according to the fourth embodiment.

A description will now be given of a detailed structure of the first amplifier circuit 4011, the second amplifier circuit 4015, the third amplifier circuit 4019 and the fourth amplifier circuit 4021. FIG. 17 illustrates the structure in which each of the amplifiers is embodied by a single-ended switched capacitor operational amplifier. FIG. 18 is a time chart illustrating the operation of the switched capacitor operational amplifier. Referring to FIG. 17, an input capacitor C401 is connected to the inverting input terminal of an operational amplifier 40100. An input voltage Vin1 is fed to the terminal via a Vin1 switch SW4012, and an input voltage Vin2 is fed thereto via a Vin2 switch SW4013. The input voltage Vin1 represents the input analog signal Vin or the analog signal input from the preceding stage. The input voltage Vin2 represents the output analog signal from the first DA converter circuit 4013 or the second DA converter circuit 4018, or the reference voltage. The non-inverting input terminal of the operational amplifier 40100 is connected to an autozero potential. The output terminal and the inverting input terminal of the operational amplifier 40100 are connected to each other via a feedback capacitor C402. An autozero switch SW4011 is connected across the feedback capacitor C402 to enable short circuit between the output terminal and the inverting input terminal of the operational amplifier 40100.

By referring to FIG. 18, a description will now be given of the operation of the single-ended switched capacitor operational amplifier illustrated in FIG. 17. In order to apply an autozero potential Vag, the autozero switch SW4011 is turned on. In this state, the input node N401 and the output node N402 are both at the autozero potential Vag. In order to sample the input voltage Vin1, the Vin1 switch SW4012 is turned on and the Vin2 switch SW4013 is turned off. At this point of time, the charge QA at the input node N401 is given by the following equation (A14)

$$QA = C401(Vin1 - Vag) \tag{A14}$$

The autozero switch SW4011 is then turned off in order to enable imaginary ground and amplification. Subsequently, in order to effect subtraction of the input voltage Vin2, the Vin1 switch SW4012 is turned off and the Vin2 switch SW4013 is turned on. At this point of time, the charge QB at the input node N401 is given by the following equation (A15).

$$QB = C401(Vin2 - Vag) + C402(Vout - Vag) \tag{A15}$$

Since there is no route for the charge to be dissipated through the input node N401, the principle of conservation of charge demands that the following equation (A16) hold.

$$Vout = C401/C402(Vin1 - Vin2) + Vag \tag{A16}$$

Accordingly, given that the autozero potential is an ideal ground potential, the single-ended switched capacitor operational amplifier is capable of amplifying a difference between the input voltage Vin1 and the input voltage Vin2 according to the capacitance ratio between the input capacitor C401 and the feedback capacitor C402. Even if the autozero potential Vag is not an ideal ground potential, an approximation can be obtained.

Figure 19:
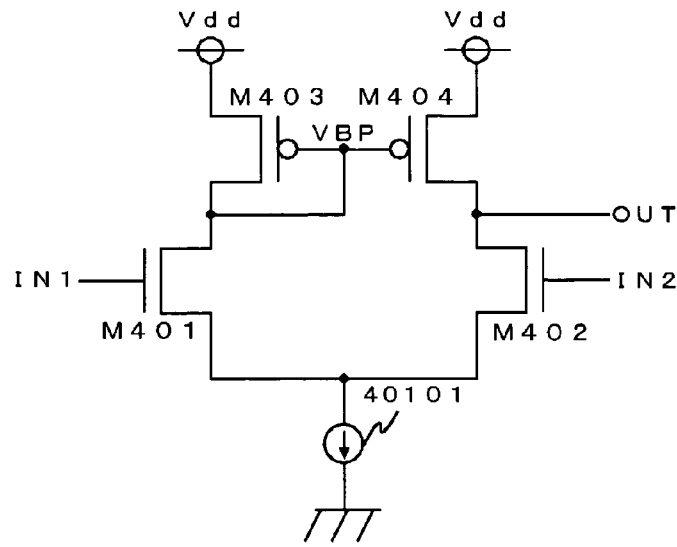
FIG. 19 illustrates an equivalent circuit of a part of the single-ended operational amplifier for differential amplification according to the fourth embodiment.

A description will now be given of an example where the operational amplifier 40100 is built using a complementary metal-oxide semiconductor (CMOS) process. FIG. 19 illustrates an equivalent circuit for a part of the single-ended operational amplifier 40100 for differential amplification. The operational amplifier 40100 is provided with P-channel MOS field effect transistors (hereinafter, referred to as a PMOS transistors) M403 and M404, N-channel MOS field effect transistors (hereinafter, referred to as NMOS transistors) M401 and M402, and a constant-current source 40101.

The pair of PMOS transistors M403 and M404 are supplied with a power supply voltage Vdd at the drains thereof and a bias voltage at the gates thereof. The pair of PMOS transistors M403 and M404 constitute a current mirror circuit and drain currents of an identical level flow in the sources thereof. The drains of the pair of NMOS transistors M401 and M402 are connected to the pair of PMOS transistors M403 and M404, respectively, and the sources of the transistors M401 and M402 are connected to the constant-current source 40101. Differential inputs IN1 and IN2 are fed to the gates of the transistors M401 and M402, respectively. An output OUT is obtained from a node between the PMOS transistor N404 and the NMOS transistor M402. The gain is determined by the mutual conductance and output resistance of the NMOS transistors M401 and M402, and the PMOS transistors M403 and M404. The constant-current source 40101 may be embodied by an NMOS transistor. The NMOS transistor is supplied with a bias voltage at the gate thereof and is operated in a saturation zone.

Figure 20:
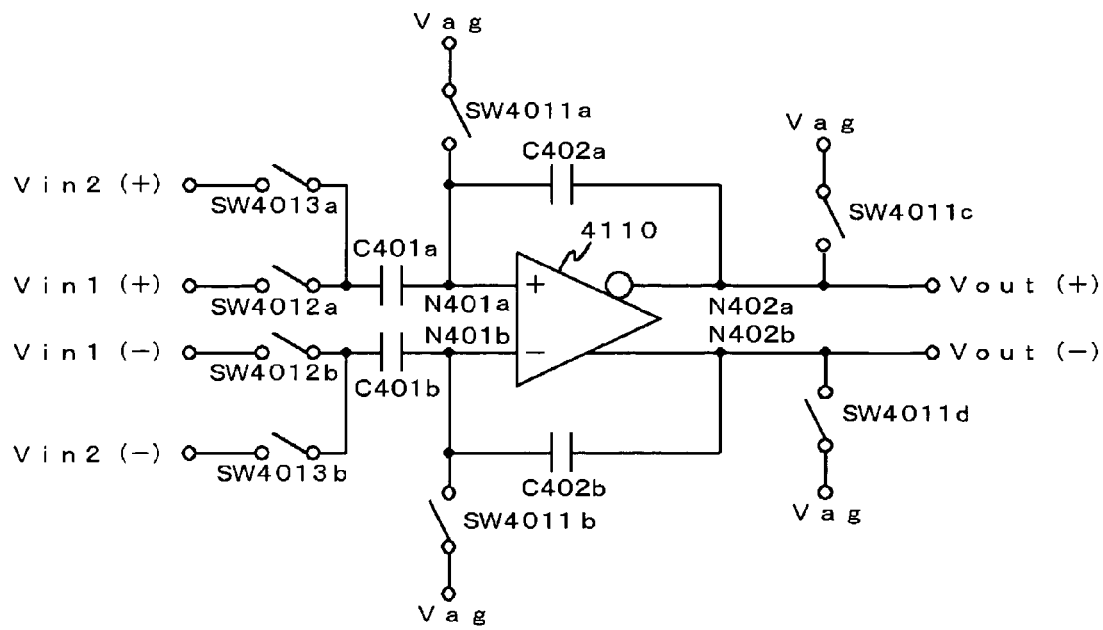
FIG. 20 illustrates the structure of a fully differential switched capacitor operational amplifier according to the fourth embodiment.

FIG. 20 illustrates the structure in which the amplifier circuit is implemented by a fully differential switched capacitor operational amplifier. In comparison with the single-ended configuration, the fully differential configuration is more tolerant of noise and the output amplitude thereof may be relatively large. Referring to FIG. 20, an input capacitor C401a is connected to the non-inverting input terminal of an operational amplifier 40110. An input voltage Vin1(+) is fed via a Vin1 switch SW4012a and an input voltage Vin2(+) is fed via a Vin2 switch SW4013a. An input capacitor C401b is connected to the inverting input terminal of the operational amplifier 40110. An input voltage Vin1(−) is fed via a Vin1 switch SW4012b and an input voltage Vin2(−) is fed via a Vin2 switch SW4013b. The inverting output terminal and the non-inverting input terminal of the operational amplifier 40110 are connected to each other via a feedback capacitor C402a. The non-inverting output terminal and the inverting input terminal of the operational amplifier 40110 are connected to each other via a feedback capacitor C402b. Autozero switches SW4011a-SW4011d are connected to the input nodes N401a and N401b, and the output nodes N402a and N402b, respectively. The autozero switches SW4011a-SW4011d are operated according to the same timing schedule. When the switches are turned on, the input nodes N401a and N401b, and the output nodes N402a and N402b are brought to the autozero potential Vag.

A description will now be given of the operation of the fully differential switched capacitor operational amplifier of FIG. 20. The timing schedule is the same as that of FIG. 18. In order to apply the autozero potential Vag, the autozero switches SW4011a-SW4011d are turned on. In this state, the input nodes N401a and N401b, and the output nodes N402a and N402b are at the autozero potential Vag. In order to sample the input voltage Vin1, the Vin1 switches SW4012a and SW4012b are turned on and the Vin2 switches SW4013a and SW4013b are turned off. At this point of time, the charge QAA at the input node N401a is given by the following equation (A17) and the charge QAB at the input node N401b is given by the following equation (A18).

$$QAA = C401a\{Vin1(+) - Vag\} \quad (A17)$$

$$QAB = C401b\{Vin1(-) - Vag\} \quad (A18)$$

The autozero switch SW4011a is then turned off in order to enable imaginary ground and amplification. Subsequently, in order to effect subtraction of the input voltage Vin2, the Vin1 switches SW4012a and SW4012b are turned off and the Vin2 switches SW4013a and SW4013b are turned on. At this point of time, the charge QBA at the input node N401a is given by the following equation (A19) and the charge QBB at the input node N401b is given by the following equation (A20).

$$QBA = C401a\{Vin2(+) - Vag\} + C402a\{Vout(+) - Vag\} \quad (A19)$$

$$QBB = C401b\{Vin2(-) - Vag\} + C402b\{Vout(-) - Vag\} \quad (A20)$$

Since there are no routes at the input end nodes N401 for dissipating the charge, the principle of conservation of charge demands that QAA=QBA and QAB=QBB so that the following equations (A21) and (A22) hold.

$$Vout(+) = C401a/C402a\{Vin1(+) - Vin2(+)\} + Vag \quad (A21)$$

$$Vout(-) = C401b/C402b\{Vin1(-) - Vin2(-)\} + Vag \quad (A22)$$

The voltage difference Vout between the two output nodes N402a and N402b is given by the following equation (A23).

$$Vout = Vout(+) - Vout(-) = C402a/C401a\{Vin1(+) - Vin2(+)\} - C402b/C401b\{Vin1(-) - Vin2(-)\} \quad (A23)$$

Accordingly, the fully differential switched capacitor operational amplifier is capable of amplifying a difference between the input voltage Vin1(+) and the input voltage Vin2(+), and the difference between the input voltage Vin1(−) and the input voltage Vin2(−), according to the capacitance ratio occurring between the input capacitors C401a, C401b and the feedback capacitors C402a, C402b, respectively.

Figure 21:
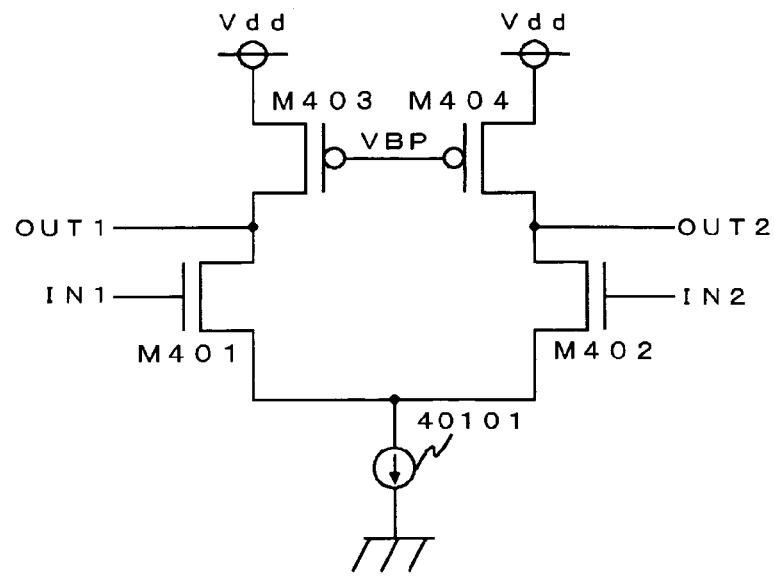
FIG. 21 illustrates an equivalent circuit of a part of the fully differential operational amplifier for differential amplification according to the fourth embodiment.

FIG. 21 illustrates an equivalent circuit for a part of the fully differential operational amplifier 40110 for differential amplification. The description given above with reference to FIG. 19 also applies to FIG. 21. Differential outputs OUT1 and OUT2 are obtained from a node between the PMOS transistor M403 and the NMOS transistor M401, and a node between the PMOS transistor M404 and the NMOS transistor M402. A through current flows from the power supply to the ground.

In a plurality of amplifier circuits 4011, 4015, 4019 and 4021 constituting the AD converter illustrated in FIG. 15, a higher precision is required in the upstream of a route transmitting the analog signal than in the downstream thereof. More specifically, the level of precision required in the respective amplifier circuits is in the descending order of the first amplifier circuit 4011, the second amplifier circuit 4015, the third amplifier circuit 4019 and the fourth amplifier circuit 4021. This is because a higher precision is required in order to convert into relatively higher bits. When the requirement for precision is lowered in the amplifier circuits 4011, 4015, 4019 and 4021, the requirement for specification such as the offset and the DC gain is lowered. The term "offset" here refers to a voltage between input terminals of an operational amplifier constituting the amplifier circuit. If the offset becomes excessively large, imaginary ground of the operational amplifier is lost and precision is lowered accordingly.

Referring to FIG. 15, the operational amplifiers, the capacitance and the size of switches constituting the four amplifier circuits 4011, 4015, 4019 and 4021 may be modified according to the required precision. When the required precision differs from circuit to circuit, It is also possible to set the circuit constant to different values for amplifier circuits with practically the same gain and providing the same function. Alternatively, the circuits may be designed with different circuit configurations. For example, a difference in circuit configuration may result even when a plurality of amplifier circuits are designed to provide the same gain (for example, the gain of 2or 4) but vary in actual performance. For example, one circuit may exhibit a precision error of 1% and the other 0.1%. The phrase "practically the same gain" includes a case where the design specifications for ideal performance of amplifier circuits are identical but the gain thereof in actual performance differs from circuit to circuit.

A description will now be given of an example of providing amplifier circuits with practically the same gain such that one is built with a higher specification and the other is built with a lower specification. The phrase "higher specification" means a relatively high performance. The performance may be evaluated for precision and speed. The performance in precision will first be described. As mentioned before, amplifiers with the same gain may be built with different precision specifications. Naturally, it is more difficult to control a precision error within 0.1% than within 1%. In order to achieve a higher specification, a high-precision specification is called for. In the case of amplifiers, a high precision is possible by increasing an open loop gain. The performance in speed will be described. When the load connected differs, the specification required of the amplifier circuit in terms of speed differs, given that the gain remains unchanged. In this case, a high-speed specification is called in order to achieve a higher specification. In the case of amplifiers, a high speed specification is achieved by increasing a slew rate.

A description will be given of specific methods of controlling the specification other than the gain by controlling the circuit constant and the circuit configuration. The term circuit constant refers to a value of transistor size, resistance, capacitance or the like. The open loop gain of the operational amplifiers 40100 and 40110 illustrated in FIG. 18 and FIG. 20, respectively, affects the characteristics of the amplifier circuits 4011, 4015, 4019 and 4021. When the open loop gain of any of the operational amplifiers 40100 and 40110 is lowered, imaginary ground of the amplifier circuits 4011, 4015, 4019 and 4021 is lost and precision is lowered accordingly. By designing the gate width of the PMOS transistors M403 and M404, and the NMOS transistors M401 and M402, constituting the operational amplifiers 40100 and 40110 illustrated in FIG. 5 and FIG. 7, respectively, to be relatively large, a relatively large drain current flows so that the gain is increased. Accordingly, precision of the amplifier circuits 4011, 4015, 4019 and 4021 is improved.

By increasing the gate width, the area occupied by the circuit is naturally increased. Therefore, the gate width of transistors constituting the amplifier circuit with a high requirement for precision may be designed to be large and the gate width of transistors constituting the amplifier circuits with a low requirement for precision may be small. For example, the gate width may be progressively lowered in the descending order of severance of requirement for precision, i.e., in the order of the first amplifier circuit 4011, the second amplifier circuit 4015, the third amplifier circuit 4019 and the fourth amplifier circuit 4021. With this approach, the objectives of high precision, reduction in area and power saving are achieved, and it is ensured that the AD converter as a whole is efficiently designed.

The capacitance of the input capacitors C401 and the feedback capacitor C402 illustrated in FIG. 18 and FIG. 20 affects the characteristics of the amplifier circuits 4011, 4015, 4019 and 4021. In the amplifier circuits 4011, 4015, 4019 and 4021 illustrated in FIG. 18 and FIG. 20, the gain is controlled according to the capacitance ratio between the input capacitor C401 and the feedback capacitor C402. In this respect, no consideration is given to the absolute value of capacitance of the input capacitor C401 and the feedback capacitor C402.

The absolute value of capacitance of the input capacitor C401 affects thermal noise from a resistance component such as the ON resistance of the Vin1 switch SW4012 and the Vin2 switch SW4013. Noise power of an RC circuit formed by the resistance component and the input capacitor C401 is approximated by kT/C401, where k indicates a Boltzmann constant and T indicates a variable denoting an absolute temperature. The above equation shows that, when the capacitance of the input capacitor C401 is decreased, thermal noise from the resistance component is increased, and, when the capacitance is increased, thermal noise is decreased. Thermal noise causes an error in the voltage input to the input capacitor C401 sampling a signal, thereby lowering precision of the amplifier circuits 4011, 4015, 4019 and 4021.

When the capacitance of the input capacitor C401 is increased, the capacitance of feedback capacitor C402 has to be increased. This naturally increases the circuit area. In a configuration such as that of an AD converter of a pipeline type in which a plurality of stages are connected in series, an increase in capacitance invites an increase in the load capacitance of the amplifier circuit, causing a current to be increased. It is therefore preferable to set the capacitance of the amplifier circuit with a high requirement for precision to a relatively large value and to set that of the circuit with a less severe requirement to a relatively small value. Referring to FIG. 15, for example, the capacitance may be progressively smaller in the descending order of severance for precision requirement, i.e. in the order of the first amplifier circuit 4011, the second amplifier circuit 4015, the third amplifier circuit 4019 and the fourth amplifier circuit 4021. With this approach, the objectives of high precision, reduction in area and power saving are achieved, and it is ensured that the AD converter as a whole is efficiently designed.

By increasing the size of the Vin1 switch SW4012 and the Vin2 switch SW4013, the ON resistance is reduced. However, this does not affect thermal noise. Reduction in the ON resistance, however, is capable of reducing a delay in the voltage input to the input capacitor C401 due to the low-pass filter effect of the RC circuit.

The power supply voltage Vdd of the operational amplifiers 40100 and 40110 illustrated in FIG. 19 and FIG. 21, respectively, affects the characteristics of the amplifier circuits 4011, 4015, 4019 and 4021. The power supply voltage Vdd may variably be set to 5V, 3.3V, 2.5V etc. For example, the power supply voltage Vdd of the amplifier circuit with a high requirement for precision may be set to a relatively high value and that of the amplifier circuit with a less severe requirement for precision may be set to a relatively low value. With this approach, the objectives high precision and power saving are achieved in a compatible manner, and the AD converter as a whole is efficiently designed.

Even when the operational amplifiers 40100 and 40110 are fabricated as shown in FIG. 19 and FIG. 21, respectively, such that one transistor is a mirror image of the other, the NMOS transistors M401 and M402 do not necessarily exhibit the same characteristics. If there is an offset between the threshold values of gate voltages of the NMOS transistor M401 and M402, the condition for imaginary ground of the operational amplifiers 40100 and 40110 is affected accordingly, causing the characteristics of the amplifier circuits 4011, 4015, 4019 and 4021 to be degraded. The larger the area of gate, variation in the characteristics of the pair of NMOS transistors M401 and M402 is reduced so that the offset is reduced. Accordingly, the gate area of the transistors constituting the amplifier circuit with a high requirement for precision may be designed to be large and the gate area of the transistors constituting the amplifier circuit with a less severe requirement for precision may be designed to be small. With this approach, the objectives high precision, reduction in area and power saving are achieved in a compatible manner, and the AD converter as a whole is efficiently designed.

The variable circuit constants may also be applied to amplifier circuits with practically the same gain. Referring to FIG. 15, the gain of the second amplifier circuit 4015, the third amplifier circuit 4019 and the fourth amplifier circuit 4021 is 2. However, the required precision differs from circuit to circuit. Accordingly, the gate width may be progressively reduced in the order of the second amplifier circuit 4015, the third amplifier circuit 4019 and the fourth amplifier circuit 4021. Alternatively, the capacitance of the input capacitor C401 and the feedback capacitor C402 may be progressively decreased also in the stated order. In this way, it is ensured that the AD converter as a whole is efficiently designed.

A description will be given of the structure of circuit. As mentioned above, when the open loop gain of any of the operational amplifiers 40100 and 40110 illustrated in FIG. 19 and FIG. 21, respectively, is lowered, precision of the amplifier circuits 4011, 4015, 4019 and 4021 becomes poor. By increasing the open loop gain of the operational amplifiers 40100 and 40110 illustrated in FIG. 19 and FIG. 21, respectively, precision of the amplifier circuits 4011, 4015, 4019 and 4021 is increased.

Figure 22:
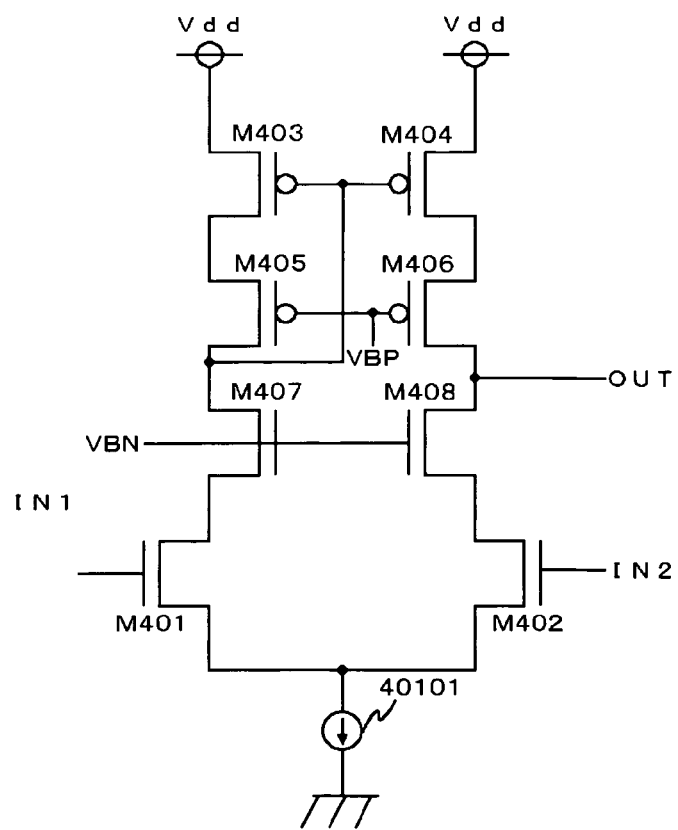
FIG. 22 illustrates a first variation of the equivalent circuit of the part of the single-ended operational amplifier for differential amplification according to the fourth embodiment.

FIG. 22 illustrates a first variation of the equivalent circuit for a part of the single-ended operational amplifier 40100 for differential amplification. The operational amplifier 100 is configured such that a pair of PMOS transistors M405 and M406, and a pair of NMOS transistors M407 and M408 are added to the operational amplifier 40100 illustrated in FIG. 19. A predetermined bias voltage is applied to the gates of the PMOS transistors M405 and M406, and the NMOS transistors M407 and M408.

The two pairs of PMOS transistors M403-M406 constitute a cascode current mirror circuit and drain currents of an identical level flow in the sources at both ends of the current mirror. The two pairs of NMOS transistors M401, M402, M407 and M408 are also in cascode connection. In comparison with the operational amplifier 40100 of FIG. 19, the mutual conductance and output resistance of the operational amplifier 40100 of FIG. 22 provided with additional transistors are increased and the gain thereof is increased, due to the mutual conductance and output resistance of the added PMOS transistor M406 and the NMOS transistor M408. By increasing the number of transistors constituting the operational amplifier 40100 in this way, the gain is increased. A point of note is that, the range required for an over drive voltage is also increased as a result of adding the PMOS transistors M405, M406 and the NMOS transistors M407 and M408, so that the permitted output voltage range of the circuit as a whole is narrowed. The permitted output voltage range can be extended by increasing the power supply voltage Vdd. In this case, however, the power consumption is increased.

Figure 23:
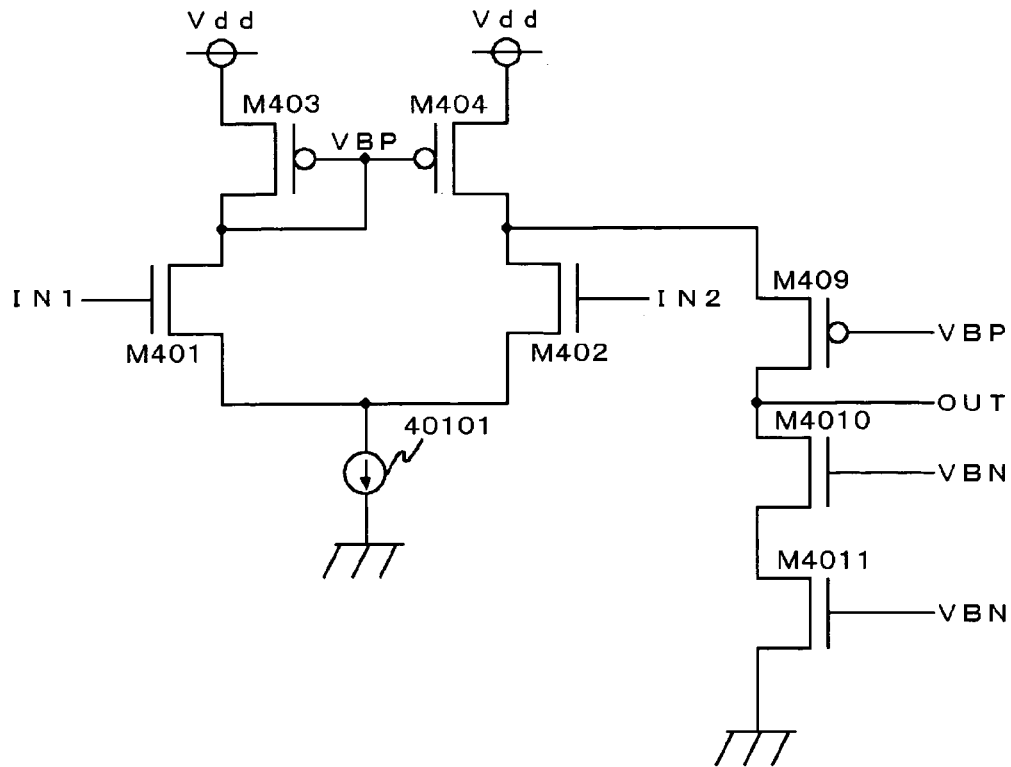
FIG. 23 illustrates a second variation of the equivalent circuit of the part of the single-ended operational amplifier for differential amplification according to the fourth embodiment.

FIG. 23 is a second variation of the equivalent circuit for a part of the single-ended operational amplifier 40100 for differential amplification. The operational amplifier 40100 illustrated in FIG. 23 is configured such that a PMOS transistor M409, and NMOS transistors M4010 and M4011 in cascode connection are added to the operational amplifier 40100 illustrated in FIG. 19. A predetermined bias voltage is applied to the gates of the PMOS transistor M409, and the NMOS transistors M4010 and M4011. The NMOS transistor M4011 functions as a constant-current source.

The output retrieved from the drain of the NMOS transistor M402 is fed to the drain of the PMOS transistor M409 for amplification. The output OUT of the circuit as a whole illustrated in FIG. 23 is retrieved from the drain of the NMOS transistor M4010. According to this circuit, the same gain as that of the circuit illustrated in FIG. 22 is obtained. Further, the permitted output voltage range is the same as that of the circuit illustrated in FIG. 19. A point of note is that the output OUT of the circuit is delayed in association with the addition of the PMOS transistor M409 and the NMOS transistors M4010 and M4011 in cascode connection. The power consumption is also increased.

The circuit of the operational amplifier 40100 is variably configured as described above. Aside from the variations described above, the gain may be increased by increasing the number of transistors or the number of stages. According to the variations in circuit configuration, performance parameters including gain, permitted output voltage range, speed and power consumption are made to vary. In this example, variable,circuit configurations may be employed depending on the use and required precision of the four amplifier circuits 4011, 4015, 4019 and 4021.

For example, referring to FIG. 15, the precision requirement is progressively less severe generally in the order of the first amplifier circuit 4011, the second amplifier circuit 4015, the third amplifier circuit 4019 and the fourth amplifier circuit 4021. In this respect, the first amplifier circuit 4011 may be in a cascode configuration so as to increase the gain thereof. Since a relatively large signal is input thereto, the first amplifier circuit 4011 may be configured to have a relatively extensive output voltage range. A relatively long period of time is permitted for operation of the first amplifier circuit 4011 so that the requirement thereof for speed is less severe. In contrast, the fourth amplifier circuit 4021 is not fed a large signal, and the requirement for precision is least severe. Therefore, it is not necessary to increase the number of transistors or the power supply voltage Vdd in order to increase the gain or extend the permitted output voltage range. The fourth amplifier circuit 4021 may best be configured as a simple circuit so as to control the circuit area and power consumption.

The variable circuit configurations may also be applied to amplifier circuits with practically the same gain. Referring to FIG. 15, the gain of the second amplifier circuit 4015, the third amplifier circuit 4019 and the fourth amplifier circuit 4021 is 2. However, required precision differs from circuit to circuit. Accordingly, the circuit configuration may progressively be simplified in the order of the second amplifier circuit 4015, the third amplifier circuit 4019 and the fourth amplifier circuit 4021. In this way, it is ensured that the AD converter as a whole is efficiently designed.

Second Example of the Fourth Embodiment

A second example of the fourth embodiment provides an AD converter of a cyclic type which first converts into 4 bits and then converts into 2 bits in each of 3 subsequent cycles, thus outputting a total of 10 bits.

Figure 24:
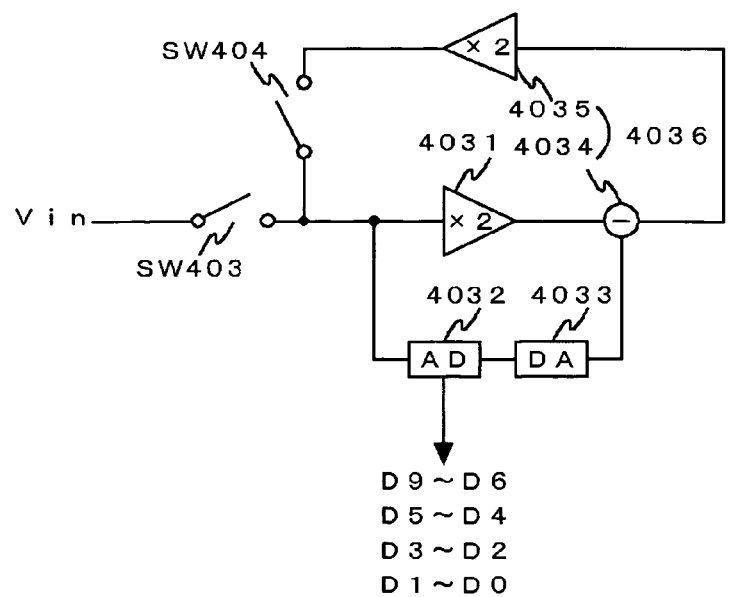
FIG. 24 illustrates the structure of the AD converter according to a second example of the fourth embodiment.

FIG. 24 illustrates the structure of the AD converter according to the second example. The first switch SW403 and the second switch SW404 are alternately turned on and off. At an initial stage, the first switch SW403 is turned on and the second switch SW404 is turned off. The input analog signal Vin is fed to a first amplifier circuit 4031 and an AD converter circuit 4032 via the first switch SW403. The AD converter circuit 4032 is of a flash type and the maximum resolution thereof, i.e. the number of bits produced by conversion therein, is 4 bits. The AD converter circuit 4032 converts the analog signal input via the first switch SW403 into a digital value, retrieves the higher 4 bits (D9-D6) and outputs the bits to the encoder (not shown) and a DA converter circuit 4033. The DA converter circuit 4033 converts the digital value produced by conversion by the first AD converter circuit 4032 into an analog value. The first amplifier circuit 4031 amplifies the input analog signal by a factor of 2 and outputs the amplified signal to a subtracter circuit 4034. The subtracter circuit 4034 subtracts the output of the DA converter circuit 4033 from the output of the first amplifier circuit 4031. The output of the DA converter circuit 4033 is practically amplified by a factor of 2. Amplification by a factor of 2 is implemented by setting the ratio between the reference voltage range of the AD converter circuit 4032 and the reference voltage range of the DA converter circuit 4033 to 1:2. A second amplifier circuit 4035 amplifies the output of the subtracter circuit 4034 by a factor of 2. The subtracter circuit 4034 and the second amplifier circuit 4035 may be an integral subtracting amplifier circuit 4036. In this way, the circuit is simplified.

At this point of time, the first-switch SW403 is turned off and the second switch SW404 has made a transition to an on state. The output analog signal of the second amplifier circuit 4035 is fed back to the first amplifier circuit 4031 and the AD converter circuit 4032 via the second switch SW404. The AD converter circuit 4032 converts the input analog signal fed via the second switch SW404 into 2 bits with the redundant 1 bit removed the signal, retrieves the 5th through 6th highest bits (D5-D4) and outputs the bits to the encoder (not shown) and the DA converter circuit 4033. The operation of the DA converter circuit 4033, the first amplifier circuit 4031, the subtracter circuit 4034 and the second amplifier circuit 4035 is the same as that of the first cycle for conversion. Since the AD converter circuit 4032 converts into 2 bits in a second and subsequent cycles, the total gain of the third amplifier circuit 4031 and the second amplifier circuit 4035 is practically 4 (2 raised to the power of 2). The process described above is repeated with the result that the AD converter circuit 4032 retrieves the 7th through 8th highest bits (D3-D2) and the 9th through 10th highest bits (D1-D0). With this, a 10-bit digital value is obtained.

The detailed structure of the first amplifier circuit 4031 and the second amplifier circuit 4035 is the same as that described in the first example of the fourth embodiment. The circuit constant and circuit configuration of the first amplifier circuit 4031 and the second amplifier circuit 4035 are similarly set and designed as those of the first example of the fourth embodiment. The second amplifier circuit 4035 is of a simpler circuit configuration than the first amplifier circuit 4031 and the circuit constant thereof need not be set in a rigorous manner.

Given above is a description of the fourth embodiment based on the examples. The description of the examples is illustrative in nature and various variations in constituting elements and processes involved are possible. Those skilled in the art would readily appreciate that the variations are also within the scope of the present invention.

Parameters such as the number of bits produced as a result of conversion, allocation of conversion bits, and the gain of the amplifier circuits given in the description above of the examples of the fourth embodiment are merely by way of example. Other parameter values may be employed in variations. The number of stages may be three or more, instead of one or two. More than one of the plurality of stages may be of a cyclic configuration.

In the first example of the fourth embodiment, the first amplifier circuit 4011 may be eliminated. By adjusting the timing according to which the input analog signal Vin is sampled by the second amplifier circuit 4015 or the first subtracting amplifying circuit 4016, or by switchably selecting the timing of input of the input analog signal Vin and the reference voltage to the voltage comparison elements constituting the first AD converter circuit 4012, the operation of the AD converter as a whole is guaranteed even when the first amplifier circuit 4011 is eliminated. In this way, the circuit area is reduced. In this case, the levels of precision required in the respective amplifier circuits is progressively less severe in the order of the second amplifier circuit 4015, the third amplifier circuit 4019 and the fourth amplifier circuit 4021. Similarly, the third amplifier circuit 4019 may be eliminated. In this case, the levels of precision required in the respective amplifier circuits is progressively less severe in the order of the first amplifier circuit 4011, the second amplifier circuit 4015 and the fourth amplifier circuit 4021.

In order to improve the timing schedule according to which the input signal is sampled, the amplifier circuits in each of the examples of the fourth embodiment are described as being embodied by a switched capacitor operational amplifier. The amplifier circuits may be configured otherwise. Generally available amplifier circuits that primarily use resistors also serve the purpose.

Further, the amplifier circuits in the examples of the fourth embodiment are described as being fabricated using a CMOS process. Alternatively, the amplifier circuits may also be fabricated using a transistor-transistor logic (TTL) process.

Although the present invention has been described by way of exemplary embodiments, it should be understood that many changes and substitutions may further be made by those skilled in the art without departing from the scope of the present invention which is defined by the appended claims.

What is claimed is:

1. An analog-digital converter comprising:
    an AD converter circuit converting an input analog signal into a digital value of a predetermined number of bits;
    a DA converter circuit converting an output of said AD converter circuit into an analog signal;
    a first amplifier circuit provided parallel with said AD converter circuit and amplifying said input analog signal by a predetermined gain;
    a subtracter circuit subtracting an output of said DA converter circuit, amplified by a gain practically identical to the gain of said first amplifier circuit, from an output of said first amplifier circuit; and a second amplifier circuit amplifying an output of said subtracter circuit and feeding the amplified output back to inputs of said AD converter circuit and said first amplifier circuit.

2. The analog-digital converter according to claim 1, wherein an amplifying gain of a system comprising said AD converter and said DA converter circuit is practically identical to the gain of said first amplifier.

3. The analog-digital converter according to claim 2, wherein a ratio between a reference voltage range accommodating a reference potential of said DA converter circuit and a reference voltage range accommodating a reference potential of said AD converter circuit is set in accordance with said predetermined gain.

4. The analog-digital converter according to claim 1, wherein a ratio between a reference voltage range accommodating a reference potential of said DA converter circuit and a reference voltage range accommodating a reference potential of said AD converter circuit is set in accordance with said predetermined gain.

5. The analog-digital converter according to claim 1, wherein said subtracter circuit and said second amplifier circuit are an integral subtracting amplifier circuit, said integral subtracting amplifier circuit amplifying the output of said AD converter circuit by a gain which is practically identical to the gain of said first amplifier circuit, and amplifying a result of subtraction from the output of said first amplifier circuit.

6. The analog-digital converter according to claim 5, wherein said integral subtracting amplifier circuit includes an operational amplifier, a first terminal for receiving the output of said first amplifier circuit and a second terminal for receiving the output of said DA converter circuit being connected to said operational amplifier, and a ratio between a capacitance connected between said second terminal and said DA converter circuit and a capacitance connected between said first terminal and said first amplifier circuit being set in accordance with said predetermined gain.

7. An analog-digital converter comprising:
   an AD converter circuit converting an input analog signal into a digital value of a predetermined number of bits;
   a DA converter circuit converting an output of said AD converter circuit into an analog signal;
   a first amplifier circuit provided parallel with said AD converter circuit and amplifying said input analog signal by a first gain;
   a subtracter circuit subtracting an output of said DA converter circuit, amplified by a gain practically identical to the gain of said first amplifier circuit, from an output of said first amplifier circuit; and
   a second amplifier circuit amplifying an output of said subtracter circuit by a second gain and feeding the amplified output back to said AD converter circuit, wherein
   a total gain, which is a product of said first gain and said second gain, represents a required gain, and said first gain is greater than 1 and equal to or smaller than said second gain.

8. The analog-digital converter according to claim 7, wherein said first gain is equal to or less than ½ of said second gain.

9. An analog-digital converter of a pipeline type comprising a plurality of stages, wherein at least one of said plurality of stages is a cyclic stage that includes the analog-digital converter according to claim 8.

10. The analog-digital converter according to claim 7, wherein said first gain of said first amplifier circuit is set to a maximum value that permits any input signal in a desired input voltage range to produce an output fitted in an output voltage range, and said second gain is set to a value which is responsible for the remainder of said required gain.

11. An analog-digital converter of a pipeline type comprising a plurality of stages, wherein at least one of said plurality of stages is a cyclic stage that includes the analog-digital converter according to claim 10.

12. An analog-digital converter of a pipeline type comprising a plurality of stages, wherein at least one of said plurality of stages is a cyclic stage that includes the analog-digital converter according to claim 7.

13. The analog-digital converter according to claim 7, wherein said first gain is 2.

14. An analog-digital converter comprising:
   an AD converter circuit converting an input analog signal into a digital value of a predetermined number of bits;
   a DA converter circuit converting an output of said AD converter circuit into an analog signal;
   a first amplifier circuit provided parallel with said AD converter circuit and amplifying said input analog signal by a first gain;
   a subtracter circuit subtracting an output of said DA converter circuit, amplified by a gain practically identical to the gain of said first amplifier circuit, from an output of said first amplifier circuit; and
   a second amplifier circuit amplifying an output of said subtracter circuit by a second gain and feeding the amplified output back to said AD converter circuit, wherein
   a total gain, which is a product of said first gain and said second gain, represents a required gain, and the first gain is set to a value close to said second gain.

15. The analog-digital converter according to claim 14, wherein said first gain and said second gain are related to each other such that one is equal to or more than ½ of the other and equal to or less than twice the other.

16. The analog-digital converter according to claim 15, wherein said first gain and said second gain are practically identical with each other.

17. An analog-digital converter of a pipeline type comprising a plurality of stages, wherein at least one of said plurality of stages is a cyclic stage that includes the analog-digital converter according to claim 16.

18. An analog-digital converter of a pipeline type comprising a plurality of stages, wherein at least one of said plurality of stages is a cyclic stage that includes the analog-digital converter according to claim 15.

19. The analog-digital converter according to claim 14, wherein said first gain and said second gain are practically identical with each other.

20. An analog-digital converter of a pipeline type comprising a plurality of stages, wherein at least one of said plurality of stages is a cyclic stage that includes the analog-digital converter according to claim 19.

21. An analog-digital converter of a pipeline type comprising a plurality of stages, wherein at least one of said plurality of stages is a cyclic stage that includes the analog-digital converter according to claim 14.

22. The analog-digital converter according to claim 14, wherein said first gain is 2.

23. An analog-digital converter converting an input analog signal into a digital signal of a plurality of bits in a plurality of stages, comprising a plurality of amplifier circuits, wherein two or more of said amplifier circuits with practically the same gain are differently designed in respect of at least one of a circuit constant and a circuit configuration, the analog-digital converter further comprising a plurality of stages converting an input analog signal into a digital value of a predetermined number of bits, wherein at least one of said plurality of stages includes two of said plurality of amplifier circuits, a first amplifier circuit of said two amplifier circuits amplifying said input analog signal by a first predetermined gain, and a second amplifier circuit of said two amplifier circuits amplifying, by a second predetermined gain, a difference between an analog signal output from said first amplifier circuit and a signal derived by conversion from a digital value, obtained by analog-to-digital conversion in a stage in which said second amplifier circuit is provided, into an analog signal amplified by practically the same gain as said first predetermined gain, and feeding back the amplified difference to an input of the stage.

24. An analog-digital converter converting an input analog signal into a digital signal of a plurality of bits in a plurality of stages, comprising a plurality of amplifier circuits, wherein two or more of said amplifier circuits with practically the same gain are differently designed in respect of at least one of a circuit constant and a circuit configuration, the AD converter according further comprising:

an AD converter circuit converting an input analog signal into a digital value of a predetermined number of bits, and a DA converter circuit converting an output of said AD converter circuit into an analog signal, wherein a first amplifier circuit of said plurality of amplifier circuits amplifies said input analog signal by a first predetermined gain, and a second amplifier circuit of said plurality of amplifier circuits amplifies, by a second predetermined gain, a difference between an analog signal output from said first amplifier circuit and an analog signal output from said DA converter circuit, amplified by practically the same gain as said first predetermined gain, and outputs the amplified difference to said AD converter circuit and said first amplifier circuit.

* * * * *